(12) United States Patent
Kurokawa

(10) Patent No.: US 8,675,382 B2
(45) Date of Patent: Mar. 18, 2014

(54) PROGRAMMABLE LSI

(75) Inventor: Yoshiyuki Kurokawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 106 days.

(21) Appl. No.: 13/362,026

(22) Filed: Jan. 31, 2012

(65) Prior Publication Data

US 2012/0212995 A1 Aug. 23, 2012

(30) Foreign Application Priority Data

Feb. 17, 2011 (JP) ................................ 2011-031790

(51) Int. Cl.
*G11C 5/06* (2006.01)
(52) U.S. Cl.
USPC ............. 365/63; 365/51; 365/72; 365/189.09
(58) Field of Classification Search
USPC ............. 365/185.11, 185.12, 185.08, 189.05, 365/189.15–189.17, 63, 51, 72, 149, 189.09
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,127,702 A | 10/2000 | Yamazaki et al. | |
| 6,172,521 B1 | 1/2001 | Motomura | |
| 6,294,274 B1 | 9/2001 | Kawazoe et al. | |
| 6,535,422 B2 * | 3/2003 | Goto et al. | ............... 365/185.11 |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| | | | |
|---|---|---|---|
| EP | 1737044 A | 12/2006 | |
| EP | 2226847 A | 9/2010 | |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — David Lam
(74) *Attorney, Agent, or Firm* — Eric J. Robinson; Robinson Intellectual Property Law Office, P.C.

(57) ABSTRACT

A low-power programmable LSI that can perform configuration (dynamic configuration) at high speed and can quickly start is provided. The programmable LSI includes a plurality of logic elements and a memory element for storing configuration data to be input to the plurality of logic elements. The plurality of logic elements each include a configuration memory. Each of the plurality of logic elements performs different arithmetic processing and changes an electrical connection between the logic elements in accordance with the configuration data stored in the configuration memory. The memory element is formed using a storage element including a transistor whose channel is formed in an oxide semiconductor layer and a node set in a floating state when the transistor is turned off.

9 Claims, 19 Drawing Sheets

(56) References Cited

U.S. PATENT DOCUMENTS

| | | | |
|---|---|---|---|
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,072,237 | B1 * | 12/2011 | Rahim et al. .................. 365/63 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0148171 | A1 | 6/2010 | Hayashi et al. |
| 2011/0175646 | A1 | 7/2011 | Takemura et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-077319 A | 3/1994 |
| JP | 08-264794 A | 10/1996 |
| JP | 10-285014 A | 10/1998 |
| JP | 11-505377 | 5/1999 |
| JP | 2000-044236 A | 2/2000 |
| JP | 2000-150900 A | 5/2000 |
| JP | 3106998 | 11/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUs on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

(56) References Cited

OTHER PUBLICATIONS

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUs on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Parks et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

(56) References Cited

OTHER PUBLICATIONS

Kimizuka.N et al., "SPINEL,YbFe2O4, and Yb2Fe3O7 Types of Structures for Compounds in the In2O3 and Sc2O3-A2O3-BO systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Kamiya et al., "Carrier transport properties and electronic structures of amorphous oxide semiconductors: the present status," Solid State Physics, Sep. 1, 2009, vol. 44, No. 9, pp. 621-633, Agne Gijutsu Center.

Jeon.S et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.

Ihun Song et al., "Short Channel Characteristics of Gallium—Indium—Zinc—Oxide Thin Film Transistors for Three-Dimensional Stacking Memory," IEEE Electron Device Letters, vol. 29, No. 6, Jun. 2008, pp. 549-552.

Ishii.T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim.W et al., "An Experimental High-Density DRAM Cell with a Built-in Gain Stage," IEEE Journal of Solid-State Circuits, Aug. 1, 1994, vol. 29, No. 8, pp. 978-981.

Shukuri.S et al., "A Complementary Gain Cell Technology for sub-1V Supply DRAMs ," IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's," IEEE Transactions on Electron Devices, Jun. 1, 1994, vol. 41, No. 6, pp. 926-931.

\* cited by examiner

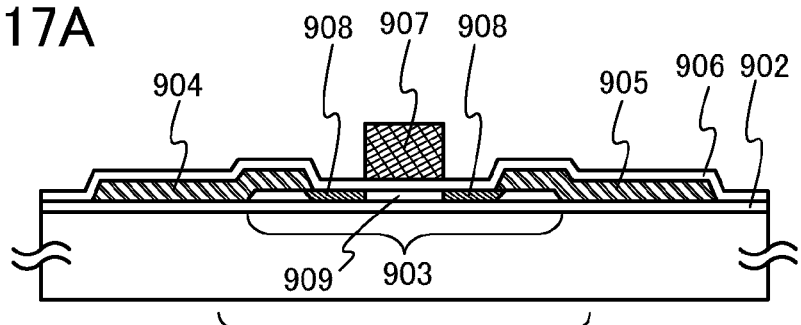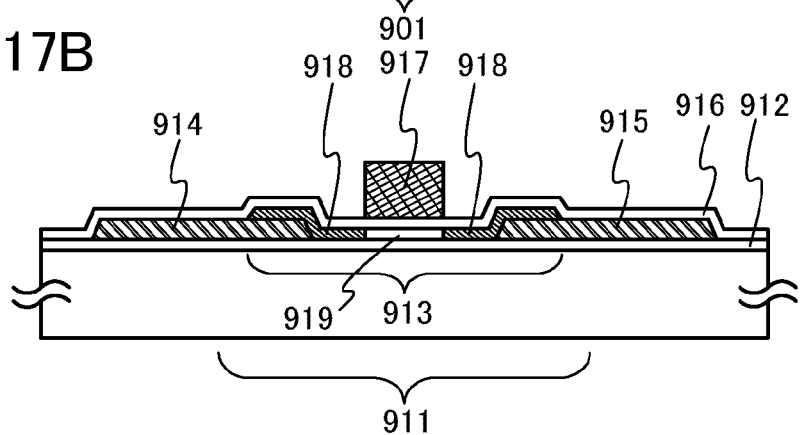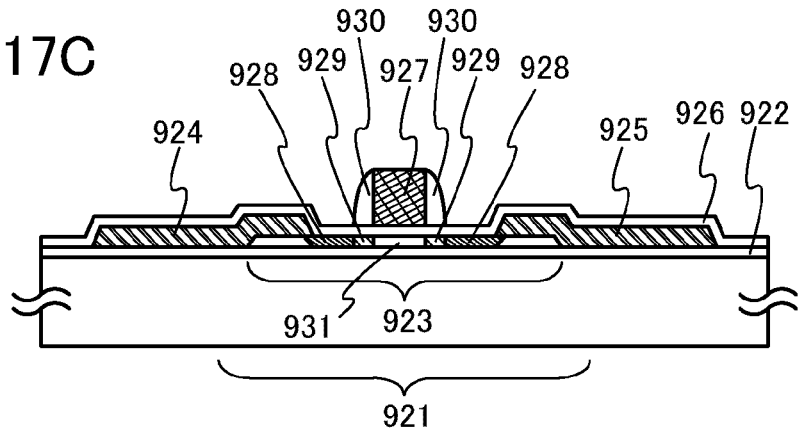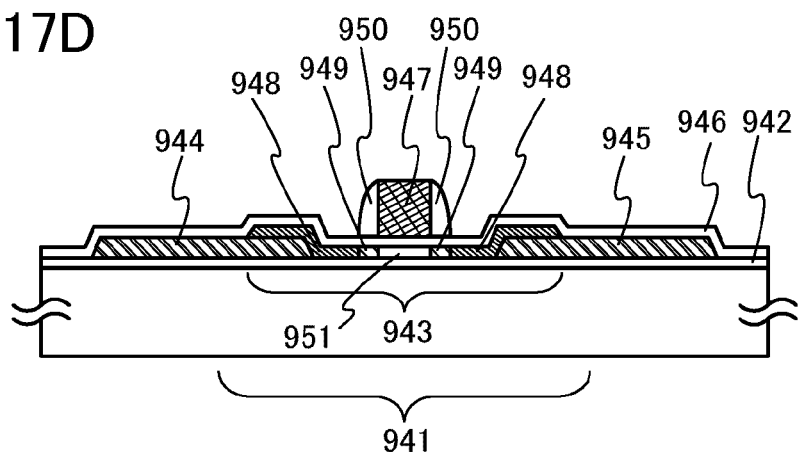

PROGRAMMABLE LSI

BACKGROUND OF THE INVENTION

1. Field of the Invention

The present invention relates to semiconductor devices. In particular, the present invention relates to programmable LSIs and semiconductor devices including the programmable LSIs. Further, the present invention relates to electronic devices including the semiconductor devices.

2. Description of the Related Art

Programmable LSIs show flexibility in a reduction in development period and a change in design specification as compared to conventional application specific integrated circuits (ASIC) and gate arrays, which is advantageous. Programmable LSIs are widely used in semiconductor devices.

A programmable LSI includes, for example, a plurality of logic elements and wirings between the logic elements. When the functions of the logic elements are changed, the function of the programmable LSI can be changed. The logic element is formed using, for example, a look-up table or the like. The look-up table performs arithmetic processing based on setting data on an input signal so that the input signal is used as an output signal. Here, the setting data is stored in storage elements that correspond to the logic elements. In other words, the look-up table can perform different arithmetic processing in accordance with the data stored in the storage elements. Thus, the functions of the logic elements can be specified when specific setting data is stored in the storage elements.

The setting data or the like of the look-up table is referred to as configuration data. In addition, the storage elements that correspond to the logic elements and store the configuration data are referred to as configuration memories. Further, storage of the configuration data in the configuration memory is referred to as configuration. In particular, rewrite (refresh) of the configuration data stored in the configuration memory is referred to as re-configuration. The circuit structure of the programmable LSI can be changed into a circuit structure suitable for a user's request when desired configuration data is produced (programmed) and configuration is performed.

The programmable LSI generally performs configuration (static configuration) under the condition that the operation of a semiconductor device including the programmable LSI is stopped. In contrast, a technique for performing configuration (dynamic configuration) when the semiconductor device operates in order to further exploit the features of the programmable LSI has attracted attention.

As a method for performing dynamic configuration, Patent Document 1 discloses a method in which a dynamic random access memory (DRAM) is provided separately from a configuration memory and configuration data to be written to the configuration memory is stored in the DRAM. The configuration memory is formed using a static random access memory (SRAM). Patent Document 1 shows a programmable LSI for performing configuration in a short time by reading configuration data from the DRAM and writing the configuration data to the SRAM that is the configuration memory.

REFERENCE

Patent Document 1: Japanese Published Patent Application No. 10-285014.

SUMMARY OF THE INVENTION

With the structure of the programmable LSI disclosed in Patent Document 1, regular refresh operation is needed in the DRAM because configuration data is stored in the DRAM. Thus, the power consumption of the programmable LSI is increased. Further, since the DRAM is a volatile memory, it is necessary to store data in the DRAM every time supply of power supply voltage to the programmable LSI is started. Consequently, in order to retain the configuration data in the programmable LSI even after the supply of power supply voltage to the programmable LSI is stopped, a nonvolatile memory is needed in addition to the DRAM. Further, large-scale data transfer from the nonvolatile memory to the DRAM is needed every time supply of power supply voltage to the programmable LSI is started; thus, it takes a long time to perform configuration. Consequently, it takes a long time for the programmable LSI to serve its function (to start).

Thus, it is an object to provide a low-power programmable LSI that can perform configuration (dynamic configuration) at high speed and can quickly start.

One aspect of a programmable LSI in the present invention includes a plurality of logic elements and a memory element for storing configuration data to be input to the plurality of logic elements. The plurality of logic elements each include a configuration memory. At least one part of configuration data stored in the memory element is input to and stored in the configuration memory. Each of the plurality of logic elements performs different arithmetic processing and changes an electrical connection between the logic elements in accordance with the configuration data stored in the configuration memory.

One aspect of a programmable LSI in the present invention includes a plurality of logic elements and a memory element for storing configuration data to be input to the plurality of logic elements. The plurality of logic elements each include a configuration memory, a look-up table, and a selection circuit. At least one part of configuration data stored in the memory element is input to and stored in the configuration memory. In each of the plurality of logic elements, the look-up table performs different arithmetic processing in accordance with the configuration data stored in the configuration memory. The selection circuit changes an electrical connection between the logic elements in accordance with the configuration data stored in the configuration memory.

One aspect of a programmable LSI in the present invention includes a plurality of logic elements and a memory element for storing configuration data to be input to the plurality of logic elements. The plurality of logic elements each include a configuration memory, a look-up table, a selection circuit, and a register. At least one part of configuration data stored in the memory element is input to and stored in the configuration memory. In each of the plurality of logic elements, the look-up table performs different arithmetic processing in accordance with the configuration data stored in the configuration memory. The selection circuit changes an electrical connection between the logic elements in accordance with the configuration data stored in the configuration memory. An output signal of the look-up table and a clock signal are input to the register, and the register outputs a signal corresponding to the output signal in synchronization with the clock signal.

(Specific Example of Memory Element)

The memory element is formed using a nonvolatile storage element. In other words, the memory element is formed using a storage element capable of retaining stored data (configuration data) for a certain period after supply of power supply voltage is stopped. A charge accumulation storage element, a resistance-change (phase-change) storage element, or the like can be used as the nonvolatile storage element.

Alternatively, as the nonvolatile storage element, it is possible to use a storage element that includes a switching element and a node set in a floating state when the switching element is turned off and holds a signal potential corresponding to data (configuration data). In that case, when an enhancement (normally off) transistor whose off-state current is extremely low is used as the switching element and a ground potential is input to a gate of the transistor while power supply voltage is not supplied to the storage element, the transistor can be turned off while power supply voltage is not supplied to the storage element. In this manner, the potential (the signal potential) of the node can be held for a long time; thus, the memory element can function as a substantial nonvolatile memory.

As a transistor whose off-state current is extremely low, it is possible to use a transistor which has a channel in a layer or substrate including a semiconductor whose band gap is wider than that of silicon. A compound semiconductor is an example of the semiconductor whose band gap is wider than that of silicon. Examples of the compound semiconductor include an oxide semiconductor, a nitride semiconductor, and the like.

For example, the memory element can be formed using a storage element that includes a transistor whose channel is formed in an oxide semiconductor layer and a node set in a floating state when the transistor is turned off. A signal potential corresponding to data (configuration data) is held in the node.

One aspect of the specific structure of the memory element formed using a storage element that includes a transistor whose channel is formed in an oxide semiconductor layer and a node set in a floating state when the transistor is turned off is described below.

(Specific Example of Storage Element included in Memory Element)

The memory element can have more than one of Structure 1-1 of the storage element, Structure 1-2 of the storage element, Structure 2-1 of the storage element, Structure 2-2 of the storage element, and Structure 3 of the storage element.

(Structure 1-1 of Storage Element)

The storage element includes a first transistor, a second transistor, and a capacitor. A channel of the first transistor is formed in an oxide semiconductor layer. A gate of the first transistor is electrically connected to a first wiring. One of a source and a drain of the first transistor is electrically connected to a second wiring. The other of the source and the drain of the first transistor is electrically connected to a gate of the second transistor. One of a source and a drain of the second transistor is electrically connected to a third wiring. The other of the source and the drain of the second transistor is electrically connected to a fourth wiring. One of a pair of electrodes of the capacitor is electrically connected to the gate of the second transistor. The other of the pair of electrodes of the capacitor is electrically connected to a fifth wiring.

Structure 1-1 of the storage element can be expressed in a different way as follows.

The storage element includes a first transistor, a second transistor, and a capacitor. A channel of the first transistor is formed in an oxide semiconductor layer. A signal potential (a signal potential input to a second wiring) corresponding to data (configuration data) is input to a gate of the second transistor and one of a pair of electrodes of the capacitor through the first transistor which is turned on by a control signal (a control signal input to a first wiring) input to a gate of the first transistor. When the first transistor is turned off by the control signal (the control signal input to the first wiring) input to the gate of the first transistor, the signal potential is held in the gate of the second transistor and the one of the pair of electrodes of the capacitor. In this manner, data is written. Further, the data is read under the condition that the potential of a source of the second transistor (the potential of a third wiring) and the potential of the other of the pair of electrodes of the capacitor (the potential of a fifth wiring) are potentials at which the state between the source and a drain of the second transistor is changed in accordance with the signal potential. Here, the state between the source and the drain of the transistor is a non-conduction state or a conduction state. By detection of the state between the source and the drain of the second transistor, data retained in the storage element is read.

Note that by control of the potential of the fifth wiring, the second transistor can be turned on, that is, the state between the source and the drain of the second transistor can be a conduction state regardless of data retained in the storage element. Further, by control of the potential of the fifth wiring, the second transistor can be turned off, that is, the state between the source and the drain of the second transistor can be a non-conduction state regardless of data retained in the storage element.

In Structure 1-1 of the storage element, the first wiring, the fifth wiring, the second wiring, and the fourth wiring are also referred to as a write word line, a read word line, a data line, and a bit line, respectively.

Here, a node which is set in a floating state when the transistor whose channel is formed in the oxide semiconductor layer is turned off can be the gate of the second transistor or the one of the pair of electrodes of the capacitor.

Note that in Structure 1-1 of the storage element, the second wiring and the fourth wiring can be merged into a single wiring. A structure where the second wiring and the fourth wiring are merged into a single wiring is Structure 1-2 of the storage element.

(Structure 1-2 of Storage Element)

The storage element includes a first transistor, a second transistor, and a capacitor. A channel of the first transistor is formed in an oxide semiconductor layer. A gate of the first transistor is electrically connected to a first wiring. One of a source and a drain of the first transistor is electrically connected to a second wiring. The other of the source and the drain of the first transistor is electrically connected to a gate of the second transistor. One of a source and a drain of the second transistor is electrically connected to a third wiring. The other of the source and the drain of the second transistor is electrically connected to the second wiring. One of a pair of electrodes of the capacitor is electrically connected to the gate of the second transistor. The other of the pair of electrodes of the capacitor is electrically connected to a fourth wiring.

Structure 1-2 of the storage element can be expressed in a different way as follows.

The storage element includes a first transistor, a second transistor, and a capacitor. A channel of the first transistor is formed in an oxide semiconductor layer. A signal potential (a signal potential input to a second wiring) corresponding to data (configuration data) is input to a gate of the second transistor and one of a pair of electrodes of the capacitor through the first transistor which is turned on by a control signal (a control signal input to a first wiring) input to a gate of the first transistor. When the first transistor is turned off by the control signal (the control signal input to the first wiring) input to the gate of the first transistor, the signal potential is held in the gate of the second transistor and the one of the pair of electrodes of the capacitor. In this manner, data is written. Further, the data is read under the condition that the potential of a source of the second transistor (the potential of a third wiring) and the potential of the other of the pair of electrodes of the capacitor (the potential of a fourth wiring) are potentials at which the state between the source and a drain of the second transistor is changed in accordance with the signal potential. Here, the state between the source and the drain of the transistor is a non-conduction state or a conduction state. By detection of the state between the source and the drain of the second transistor, data retained in the storage element is read.

Note that by control of the potential of the fourth wiring, the second transistor can be turned on, that is, the state between the source and the drain of the second transistor can be a conduction state regardless of data retained in the storage element. Further, by control of the potential of the fourth wiring, the second transistor can be turned off, that is, the state between the source and the drain of the second transistor can be a non-conduction state regardless of data retained in the storage element.

In Structure 1-2 of the storage element, the first wiring, the fourth wiring, and the second wiring are also referred to as a write word line, a read word line, and a bit line, respectively.

Here, a node which is set in a floating state when the transistor whose channel is formed in the oxide semiconductor layer is turned off can be the gate of the second transistor or the one of the pair of electrodes of the capacitor.

(Structure 2-1 of Storage Element)

The storage element includes a first transistor, a second transistor, and a third transistor. A channel of the first transistor is formed in an oxide semiconductor layer. A gate of the first transistor is electrically connected to a first wiring. One of a source and a drain of the first transistor is electrically connected to a second wiring. The other of the source and the drain of the first transistor is electrically connected to a gate of the second transistor. One of a source and a drain of the second transistor is electrically connected to a third wiring. The other of the source and the drain of the second transistor is electrically connected to a fourth wiring through a source and a drain of the third transistor. A gate of the third transistor is electrically connected to a fifth wiring.

Structure 2-1 of the storage element can be expressed in a different way as follows.

The storage element includes a first transistor, a second transistor, and a third transistor. A channel of the first transistor is formed in an oxide semiconductor layer. A signal potential (a signal potential input to a second wiring) corresponding to data (configuration data) is input to a gate of the second transistor through the first transistor which is turned on by a control signal (a control signal input to a first wiring) input to a gate of the first transistor. When the first transistor is turned off by the control signal (the control signal input to the first wiring) input to the gate of the first transistor, the signal potential is held in the gate of the second transistor. In this manner, data is written. Further, the data is read under the condition that the potential of a source of the second transistor (the potential of a third wiring) is a potential at which the state between the source and a drain of the second transistor is changed in accordance with the signal potential and that the third transistor is turned on by a control signal (a control signal input to a fifth wiring) input to a gate of the third transistor. Here, the state between the source and the drain of the transistor is a non-conduction state or a conduction state. By detection of the state between the source and the drain of the second transistor, data retained in the storage element is read.

Note that a constant potential (e.g., a low power supply potential such as a ground potential) can be input to the third wiring.

In Structure 2-1 of the storage element, the first wiring, the fifth wiring, the second wiring, and the fourth wiring are also referred to as a write word line, a read word line, a data line, and a bit line, respectively.

Here, a node which is set in a floating state when the transistor whose channel is formed in the oxide semiconductor layer is turned off can be the gate of the second transistor.

Note that in Structure 2-1 of the storage element, the second wiring and the fourth wiring can be merged into a single wiring. A structure where the second wiring and the fourth wiring are merged into a single wiring is Structure 2-2 of the storage element.

(Structure 2-2 of Storage Element)

The storage element includes a first transistor, a second transistor, and a third transistor. A channel of the first transistor is formed in an oxide semiconductor layer. A gate of the first transistor is electrically connected to a first wiring. One of a source and a drain of the first transistor is electrically connected to a second wiring. The other of the source and the drain of the first transistor is electrically connected to a gate of the second transistor. One of a source and a drain of the second transistor is electrically connected to a third wiring. The other of the source and the drain of the second transistor is electrically connected to the second wiring through a source and a drain of the third transistor. A gate of the third transistor is electrically connected to a fourth wiring.

Structure 2-2 of the storage element can be expressed in a different way as follows.

The storage element includes a first transistor, a second transistor, and a third transistor. A channel of the first transistor is formed in an oxide semiconductor layer. A signal potential (a signal potential input to a second wiring) corresponding to data (configuration data) is input to a gate of the second transistor through the first transistor which is turned on by a control signal (a control signal input to a first wiring) input to a gate of the first transistor. When the first transistor is turned off by the control signal (the control signal input to the first wiring) input to the gate of the first transistor, the signal potential can be held in the gate of the second transistor. In this manner, data is written. Further, the data is read under the condition that the potential of a source of the second transistor (the potential of a third wiring) is a potential at which the state between the source and a drain of the second transistor is changed in accordance with the signal potential and that the third transistor is turned on by a control signal (a control signal input to a fourth wiring) input to a gate of the third transistor. Here, the state between the source and the drain of the transistor is a non-conduction state or a conduction state. By detection of the state between the source and the drain of the second transistor, data retained in the storage element is read.

Note that a constant potential (e.g., a low power supply potential such as a ground potential) can be input to the third wiring.

In Structure 2-2 of the storage element, the first wiring, the fourth wiring, and the second wiring are also referred to as a write word line, a read word line, and a bit line, respectively.

Here, a node which is set in a floating state when the transistor whose channel is formed in the oxide semiconductor layer is turned off can be the gate of the second transistor.

(Structure 3 of Storage Element)

The storage element includes a transistor and a capacitor. A channel of the transistor is formed in an oxide semiconductor layer. A gate of the transistor is electrically connected to a first wiring. One of a source and a drain of the transistor is electrically connected to a second wiring. The other of the source and the drain of the transistor is electrically connected to one of a pair of electrodes of the capacitor.

In Structure 3 of the storage element, the other of the pair of electrodes of the capacitor can be electrically connected to a third wiring. A constant potential (e.g., a low power supply potential such as a ground potential) can be input to the third wiring.

Structure 3 of the storage element can be expressed in a different way as follows.

The storage element includes a transistor and a capacitor. A channel of the transistor is formed in an oxide semiconductor layer. A signal potential (a signal potential input to a second wiring) corresponding to data (configuration data) is input to one of a pair of electrodes of the capacitor through the transistor which is turned on by a control signal (a control signal input to a first wiring) input to a gate of the transistor. Then, when the transistor is turned off by the control signal (the control signal input to the first wiring) input to the gate of the transistor, the signal potential is held in the capacitor. In this manner, data is written. After that, data retained in the storage element is read by detection of the signal potential held in the one of the pair of electrodes of the capacitor (can also be referred to as the amount of electric charge corresponding to the signal potential) from the second wiring while the transistor is turned on by the control signal (the control signal input to the first wiring) input to the gate of the transistor.

In Structure 3 of the storage element, the first wiring and the second wiring are also referred to as a word line and a bit line, respectively.

Here, a node which is set in a floating state when the transistor whose channel is formed in the oxide semiconductor layer is turned off can be the one of the pair of electrodes of the capacitor.

The above is the description of variations of the storage element included in the memory element.

(Variations of Structure of Memory Element)

The memory element can include a memory cell array including the plurality of storage elements arranged in matrix. In that case, in the memory cell array, a wiring (e.g., a word line, a write word line, or a read word line) can be used in common among the storage elements arranged in one row and a wiring (e.g., a bit line or a data line) can be used in common among the storage elements arranged in one column The memory element can include a decoder (a row decoder or a column decoder). A given storage element in the memory cell array can be selected by the decoder. Data is written to and read from the selected storage element.

The memory element can include a sense amplifier. The potential of a bit line can be input to the sense amplifier. A signal read from the storage element can be amplified by the sense amplifier. A latch sense amplifier can be used as the sense amplifier. Alternatively, a different sense amplifier may be used. For example, an inverter, a buffer, or an operational amplifier may be used.

The memory element can include a precharge circuit. The precharge circuit has a function of precharging the potential of a bit line.

The memory element may include a temporary storage circuit such as a page buffer. Data input to the memory element can be written to the temporary storage circuit and can be held. Then, the data can be written to a given storage element in the memory cell array.

The above is the description of variations of the memory element.

(Variations of Component of Programmable LSI)

The configuration memory may include a storage element including a latch circuit. The configuration memory may include a storage element including a capacitor.

In the case where the configuration memory includes a storage element including a latch circuit, the storage element can be used as a substitute for the sense amplifier of the memory element.

The memory element includes a storage element whose predetermined node is set in a floating state when a transistor whose channel is formed in an oxide semiconductor layer is turned off and holds a signal potential corresponding to data in the node. The off-state current of the transistor whose channel is formed in the oxide semiconductor layer is extremely low. Thus, a fluctuation in the signal potential due to leakage of the transistor can be inhibited. In this manner, each storage element included in the memory element can continue to hold a signal potential corresponding to data (configuration data) for a long time after supply of power supply voltage to the memory element is stopped. In short, the memory element can function like a nonvolatile memory.

In a programmable LSI including such a memory element and a plurality of logic elements, regular refresh operation of the memory element is not needed or the frequency of refresh operation can be markedly decreased; thus, power consumption can be reduced. Further, it is not necessary to write data to the memory element every time supply of power supply voltage to the programmable LSI is started. Thus, the configuration time can be shortened. Consequently, the time to serve the predetermined function of the programmable LSI (the time to start the programmable LSI) can be shortened.

In this manner, it is possible to provide a low-power programmable LSI that can perform configuration (dynamic configuration) at high speed and can quickly start.

BRIEF DESCRIPTION OF THE DRAWINGS

In the accompanying drawings:

FIGS. 17A to 17D are cross-sectional views each illustrating the structure of a transistor whose channel is formed in an oxide semiconductor layer;

DETAILED DESCRIPTION OF THE INVENTION

Figure 1A:
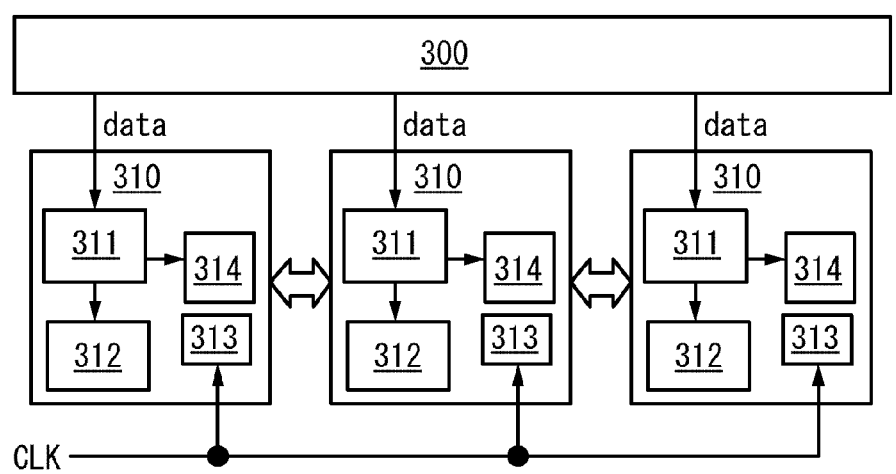
FIG. 1A is a block diagram of a programmable LSI and FIGS. 1B to 1D are circuit diagrams of storage elements.

Embodiments and an example will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments and the example.

Note that functions of a "source" and a "drain" might interchange when a transistor of opposite polarity is used or the direction of current flow is changed in circuit operation, for example. Thus, in this specification, the terms "source" and "drain" can interchange.

The expression "electrically connected" includes the case where components are connected to each other through an object having any electric action. Here, there is no particular limitation on an object having any electric action as long as electric signals can be transmitted and received between components that are connected to each other. Examples of an "object having any electric action" include a switching element such as a transistor, a resistor, an inductor, a capacitor, and an element with a variety of functions in addition to an electrode and a wiring.

In addition, even when independent components are electrically connected to each other in a circuit diagram, there is the case where one conductive film has functions of a plurality of components, such as the case where part of a wiring functions as an electrode. The expression "electrically connected" in this specification also includes such a case where one conductive film has functions of a plurality of components.

The term "over" or "below" does not necessarily mean that a component is placed "directly on" or "directly under" another component. For example, the expression "a gate electrode over a gate insulating layer" does not exclude the case where another component is placed between the gate insulating layer and the gate electrode.

The position, size, range, or the like of each component illustrated in drawings and the like is not accurately represented in some cases for easy understanding. Thus, the disclosed invention is not necessarily limited to the position, size, range, or the like disclosed in the drawings and the like.

Ordinal numbers such as "first", "second", and "third" are used in order to avoid confusion among components.

Embodiment 1

One aspect of a programmable LSI is described.

FIG. 1A schematically illustrates the structure of a programmable LSI. The programmable LSI includes a plurality of logic elements 310 and a memory element 300. FIG. 1A typically illustrates the three logic elements 310. The number of logic elements can be a given number. Alternatively, the programmable LSI may further include plural sets of the plurality of logic elements 310 and the memory element 300. Alternatively, the programmable LSI may further include a multiplier, a RAM block, a PLL block, or an I/O element. The multiplier has a function of multiplying plural pieces of data at high speed. The RAM block has a function of storing given data as a memory. The PLL block has a function of supplying a clock signal to a circuit in the programmable LSI. The I/O element has a function of controlling signal passing between the programmable LSI and an external circuit.

The logic element 310 includes a configuration memory 311, a look-up table 312, a selection circuit 314, and a register 313. Note that the logic element 310 may further include a different register, a multiplexer, or a switch.

A known storage element can be used as the configuration memory 311.

In the logic element 310, the look-up table 312 performs different arithmetic processing in accordance with configuration data stored in the configuration memory 311.

In the logic element 310, the selection circuit 314 changes an electrical connection with the different logic element 310 in accordance with the configuration data stored in the configuration memory 311. For example, the selection circuit 314 changes an electrical connection in a wiring resource provided in the programmable LSI. In this manner, an electrical connection between the logic elements 310 or an electrical connection between the logic element 310 and a different circuit (e.g., a multiplier, a RAM block, a PLL block, or an I/O element) is changed.

In the logic element 310, an output signal of the look-up table 312 and a clock signal (CLK) are input to the register 313, and a signal corresponding to the output signal is output in synchronization with the clock signal (CLK). The output signal of the register 313 or the output signal of the look-up table 312 is used as an output signal of the logic element 310 and is output to the predetermined logic element 310 or the like in accordance with an electrical connection selected by the selection circuit 314. Here, in the logic element 310, a multiplexer or the like for selecting the output signal of the register 313 or the output signal of the look-up table 312 may be provided.

Note that although FIG. 1A schematically illustrates the structure where the configuration memories 311 are positioned in one place in one logic element 310, this embodiment is not limited to this structure. The configuration memories 311 may be positioned in a plurality of places so that they are provided in the look-up table 312, the selection circuit 314, and the like.

Note that in the structure of the logic element 310 illustrated in FIG. 1A, it is possible not to provide the register 313. Alternatively, the programmable LSI may include the logic element 310 that includes the register 313 and the logic element 310 that does not include the register 313. In the logic element 310 that does not include the register 313, the output of the look-up table 312 can be used as the output of the logic element 310.

(Structure of Memory Element 300)

Figure 1B:
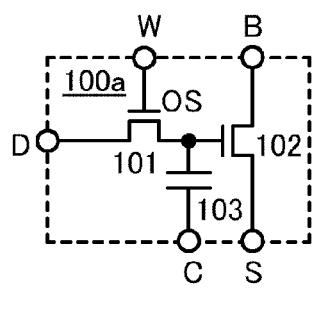
Figure 1C:
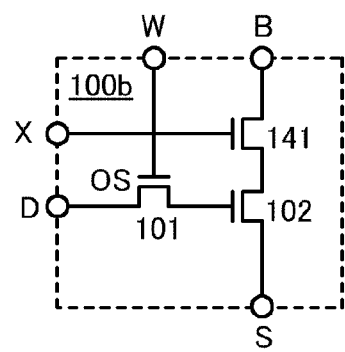
Figure 1D:
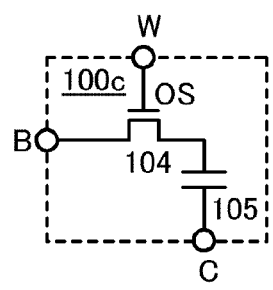

The memory element 300 can be formed using a plurality of storage elements each including a transistor whose channel is formed in an oxide semiconductor layer and a node set in a floating state when the transistor is turned off. FIGS. 1B to 1D illustrate one aspect of the storage element.

(Structure 1 of Storage Element)

A storage element 100a illustrated in FIG. 1B includes a transistor 101, a transistor 102, and a capacitor 103. A channel of the transistor 101 is formed in an oxide semiconductor layer. Note that in FIG. 1B, "OS" is written beside the transistor 101 in order to indicate that the channel of the transistor 101 is formed in the oxide semiconductor layer. A gate of the transistor 101 is electrically connected to a terminal W. One of a source and a drain of the transistor 101 is electrically connected to a terminal D. The other of the source and the drain of the transistor 101 is electrically connected to a gate of the transistor 102. One of a source and a drain of the transistor 102 is electrically connected to a terminal S. The other of the source and the drain of the transistor 102 is electrically connected to a terminal B. One of a pair of electrodes of the capacitor 103 is electrically connected to the gate of the transistor 102. The other of the pair of electrodes of the capacitor 103 is electrically connected to a terminal C. Here, each terminal can be electrically connected to a wiring or an electrode.

A wiring electrically connected to the terminal W, a wiring electrically connected to the terminal C, a wiring electrically connected to the terminal D, and a wiring electrically connected to the terminal B are also referred to as a write word line, a read word line, a data line, and a bit line, respectively. Note that the data line and the bit line can be merged into a single wiring. Here, in the case where the data line and the bit line are merged into a single wiring, the wiring is referred to as a bit line.

Here, a node which is set in a floating state when the transistor 101 whose channel is formed in the oxide semiconductor layer is turned off can be the gate of the transistor 102 or the one of the pair of electrodes of the capacitor 103.

(Method for Driving Storage Element 100a)

A method for driving the storage element 100a illustrated in FIG. 1B is described.

First, writing of data to the storage element 100a is described. A signal potential (a signal potential input to the terminal D) corresponding to data (configuration data) is input to the gate of the transistor 102 and the one of the pair of electrodes of the capacitor 103 through the transistor 101 which is turned on by a control signal (a control signal input to the terminal W) input to the gate of the transistor 101. Then, when the transistor 101 is turned off by the control signal (the control signal input to the terminal W) input to the gate of the transistor 101, the signal potential is held in the gate of the transistor 102 and the one of the pair of electrodes of the capacitor 103. In this manner, data can be written to the storage element 100a.

Here, the off-state current of the transistor 101 whose channel is formed in the oxide semiconductor layer is extremely low. When an enhancement (normally off) transistor is used as the transistor 101 and a ground potential is input to the gate of the transistor 101 while power supply voltage is not supplied to the storage element 100a, the transistor 101 can be turned off while power supply voltage is not supplied to the storage element 100a. In this manner, the potentials (the signal potentials) of the gate of the transistor 102 and the one of the pair of electrodes of the capacitor 103 can be held for a long time even while power supply voltage is not supplied to the storage element 100a. Thus, the storage element 100a can retain data even after supply of power supply voltage is stopped.

Then, reading of data from the storage element 100a is described. The potential of the source (the terminal S) of the transistor 102 and the potential of the other of the pair of electrodes (the terminal C) of the capacitor 103 are potentials at which the state between the source and the drain of the transistor 102 is changed in accordance with the signal potentials. Here, the state between the source and the drain of the transistor 102 is a non-conduction state or a conduction state. By detection of the state between the source and the drain of the transistor 102, data retained in the storage element 100a is read.

Note that by control of the potential of the terminal C, the transistor 102 can be turned on, that is, the state between the source and the drain of the transistor 102 can be a conduction state regardless of data retained in the storage element 100a. Further, by control of the potential of the terminal C, the transistor 102 can be turned off, that is, the state between the source and the drain of the transistor 102 can be a non-conduction state regardless of data retained in the storage element 100a.

The above is the description of the method for driving the storage element 100a.

When data is written to and read from each of the plurality of storage elements 100a included in the memory element 300 as described above, the memory element 300 can write and read plural pieces of data (configuration data).

(Structure 2 of Storage Element)

A storage element whose structure is different from Structure 1 of the storage element is described.

A storage element 100b illustrated in FIG. 1C includes the transistor 101, the transistor 102, and a transistor 141. The channel of the transistor 101 is formed in the oxide semiconductor layer. Note that in FIG. 1C, "OS" is written beside the transistor 101 in order to indicate that the channel of the transistor 101 is formed in the oxide semiconductor layer. The gate of the transistor 101 is electrically connected to the terminal W. The one of the source and the drain of the transistor 101 is electrically connected to the terminal D. The other of the source and the drain of the transistor 101 is electrically connected to the gate of the transistor 102. The one of the source and the drain of the transistor 102 is electrically connected to the terminal S. The other of the source and the drain of the transistor 102 is electrically connected to the terminal B through a source and a drain of the transistor 141. A gate of the transistor 141 is electrically connected to a terminal X. Here, each terminal can be electrically connected to a wiring or an electrode.

The wiring electrically connected to the terminal W, a wiring electrically connected to the terminal X, the wiring electrically connected to the terminal D, and the wiring electrically connected to the terminal B are also referred to as a write word line, a read word line, a data line, and a bit line, respectively. Note that the data line and the bit line can be merged into a single wiring. Here, in the case where the data line and the bit line are merged into a single wiring, the wiring is referred to as a bit line.

Here, a node which is set in a floating state when the transistor 101 whose channel is formed in the oxide semiconductor layer is turned off can be the gate of the transistor 102.

(Method for Driving Storage Element 100b)

A method for driving the storage element 100b illustrated in FIG. 1C is described.

First, writing of data to the storage element 100b is described. A signal potential (a signal potential input to the terminal D) corresponding to data (configuration data) is input to the gate of the transistor 102 through the transistor 101 which is turned on by a control signal (a control signal input to the terminal W) input to the gate of the transistor 101. Then, when the transistor 101 is turned off by the control signal (the control signal input to the terminal W) input to the gate of the transistor 101, the signal potential is held in the gate of the transistor 102. In this manner, data can be written to the storage element 100b.

Here, the off-state current of the transistor 101 whose channel is formed in the oxide semiconductor layer is extremely low. When an enhancement (normally off) transistor is used as the transistor 101 and a ground potential is input to the gate of the transistor 101 while power supply voltage is not supplied to the storage element 100b, the transistor 101 can be turned off while power supply voltage is not supplied to the storage element 100b. In this manner, the potential (the signal potential) of the gate of the transistor 102 can be held for a long time even while power supply voltage is not supplied to the storage element 100b. Thus, the storage element 100b can retain data even after supply of power supply voltage is stopped.

Then, reading of data from the storage element 100b is described. The potential of the source (the terminal S) of the transistor 102 is a potential at which the state between the source and the drain of the transistor 102 is changed in accordance with the signal potential. Here, the state between the source and the drain of the transistor 102 is a non-conduction state or a conduction state. Data retained in the storage element 100b is read by detection of the state between the source and the drain of the transistor 102 while the transistor 141 is turned on by a control signal (a control signal input to the terminal X) input to the gate of the transistor 141.

Note that a constant potential (e.g., a low power supply potential such as a ground potential) can be input to the terminal S (a wiring electrically connected to the terminal S).

The above is the description of the method for driving the storage element 100b.

When data is written to and read from each of the plurality of storage elements 100b included in the memory element 300 as described above, the memory element 300 can write and read plural pieces of data (configuration data).

(Structure 3 of Storage Element)

A storage element whose structure is different from Structure 1 of the storage element and Structure 2 of the storage element is described.

A storage element 100c illustrated in FIG. 1D includes a transistor 104 and a capacitor 105. A channel of the transistor 104 is formed in an oxide semiconductor layer. In FIG. 1D, "OS" is written beside the transistor 104 in order to indicate that the channel of the transistor 104 is formed in the oxide semiconductor layer. A gate of the transistor 104 is electrically connected to the terminal W. One of a source and a drain of the transistor 104 is electrically connected to the terminal B. The other of the source and the drain of the transistor 104 is electrically connected to one of a pair of electrodes of the capacitor 105. Here, each terminal can be electrically connected to a wiring or an electrode.

The wiring electrically connected to the terminal W and the wiring electrically connected to the terminal B are also referred to as a word line and a bit line, respectively.

Here, a node which is set in a floating state when the transistor 104 whose channel is formed in the oxide semiconductor layer is turned off can be the one of the pair of electrodes of the capacitor 105.

(Method for Driving Storage Element 100c)

A method for driving the storage element 100c illustrated in FIG. 1D is described.

First, writing of data to the storage element 100c is described. A signal potential (a signal potential input to the terminal B) corresponding to data (configuration data) is input to the one of the pair of electrodes of the capacitor 105 through the transistor 104 which is turned on by a control signal (a control signal input to the terminal W) input to the gate of the transistor 104. Then, when the transistor 104 is turned off by the control signal (the control signal input to the terminal W) input to the gate of the transistor 104, the signal potential is held in the capacitor 105. In this manner, data can be written to the storage element 100c.

Here, the off-state current of the transistor 104 whose channel is formed in the oxide semiconductor layer is extremely low. When an enhancement (normally off) transistor is used as the transistor 104 and a ground potential is input to the gate of the transistor 104 while power supply voltage is not supplied to the storage element 100c, the transistor 104 can be turned off while power supply voltage is not supplied to the storage element 100c. In this manner, the potential (the signal potential) of the one of the pair of electrodes of the capacitor 105 can be held for a long time even while power supply voltage is not supplied to the storage element 100c. Thus, the storage element 100c can retain data even after supply of power supply voltage is stopped.

Then, reading of data from the storage element 100c is described. Data retained in the storage element 100c is read by detection of the signal potential held in the one of the pair of electrodes of the capacitor 105 (can also be referred to as the amount of electric charge corresponding to the signal potential) from the terminal B while the transistor 104 is turned on by the control signal (the control signal input to the terminal W) input to the gate of the transistor 104.

Note that the other of the pair of electrodes of the capacitor 105 can be electrically connected to the terminal C. A constant potential (e.g., a low power supply potential such as a ground potential) can be input to the terminal C.

The above is the description of the method for driving the storage element 100c.

When data is written to and read from each of the plurality of storage elements 100c included in the memory element 300 as described above, the memory element 300 can write and read plural pieces of data (configuration data).

(Variation of Storage Element)

In Structure 1 of the storage element, Structure 2 of the storage element, or Structure 3 of the storage element, the storage element may further include a diode, a resistor, or a switch. For example, an analog switch, a transistor, or the like can be used as the switch. For example, in Structure 2 of the storage element, the storage element may further include a capacitor, and one of a pair of electrodes of the capacitor may be electrically connected to the gate of the transistor 102. A constant potential (e.g., a low power supply potential such as a ground potential) can be input to the other of the pair of electrodes of the capacitor.

Note that the memory element 300 can include memory capacitance for storing plural sets of configuration data corresponding to the state of the logic element 310 (the kind of logic operation performed by the look-up table 312 and a connection relation selected by the selection circuit 314), and given one set of configuration data can be selected from the plural sets of configuration data so that the data can be stored in the configuration memory 311.

The above is one aspect of a programmable LSI in the present invention.

With such a structure, the memory element 300 can continue to hold a signal potential corresponding to data (configuration data) for a long time after supply of power supply voltage to the memory element 300 is stopped. In short, the memory element 300 can function like a nonvolatile memory.

In a programmable LSI including the memory element 300 and the plurality of logic elements 310, regular refresh operation of the memory element 300 is not needed or the frequency of refresh operation can be markedly decreased; thus, power consumption can be reduced. Further, it is not necessary to write data to the memory element 300 every time supply of power supply voltage to the programmable LSI is started. Thus, the configuration time can be shortened. Consequently, the time to serve the predetermined function of the programmable LSI (the time to start the programmable LSI) can be shortened.

In this manner, it is possible to provide a low-power programmable LSI that can perform configuration (dynamic configuration) at high speed and can quickly start.

This embodiment can be combined with any of the other embodiments as appropriate.

Embodiment 2

In this embodiment, a more specific aspect of the memory element 300 in Embodiment 1 is described.

The memory element 300 can include a memory cell array including the plurality of storage elements in Embodiment 1 (having Structure 1 of the storage element, Structure 2 of the storage element, or Structure 3 of the storage element) arranged in matrix.

The memory element 300 can include any of or all of a decoder (a row decoder or a column decoder), a precharge circuit, a sense amplifier, and a temporary storage circuit in addition to the memory cell array. Note that some of these circuits can be merged into a single circuit. For example, the sense amplifier may function as a temporary storage circuit.

The decoder (the row decoder or the column decoder) has a function of selecting a given storage element in the memory cell array. The memory element 300 writes and reads data to and from the storage element selected by the decoder (the row decoder or the column decoder). The precharge circuit has a function of setting (precharging) the potential of a bit line included in the memory cell array to a predetermined potential before data is read from the storage element. Since data can be read from the storage element after the potential of the bit line is set (precharged) to the predetermined potential by the precharge circuit, the speed of reading data from the storage element can be increased. The sense amplifier has a function of amplifying the potential of the bit line that corresponds to data retained in the storage element and outputting the amplified potential. Data can be read more quickly and accurately by the sense amplifier. The temporary storage circuit is also referred to as a page buffer or a latch circuit and has a function of temporarily retaining data input from the outside of the memory element. The temporary storage circuit may have a function of retaining data read from the memory cell array.

Figure 2:
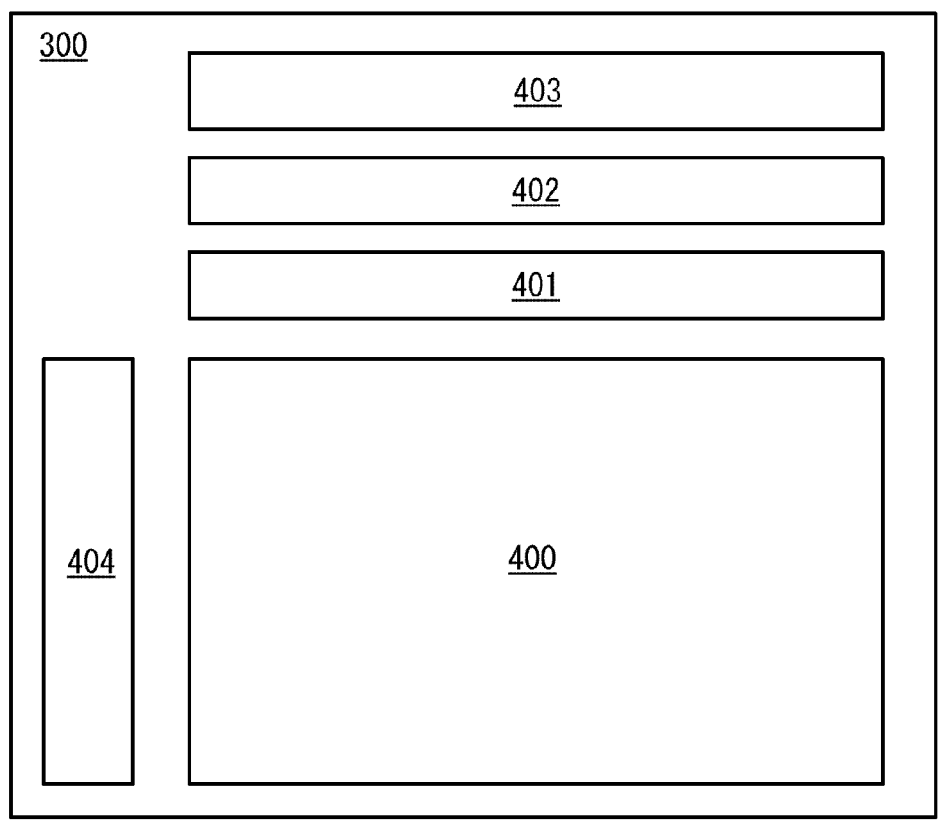
FIG. 2 is a block diagram of a memory element.

FIG. 2 schematically illustrates one aspect of the structure of the memory element 300. In FIG. 2, the memory element 300 includes a memory cell array 400, a column decoder 403, a row decoder 404, a precharge circuit 402, and a sense amplifier 401.

Note that although FIG. 2 illustrates the structure where the precharge circuit 402 and the sense amplifier 401 are provided on a side of the memory cell array 400 where the column decoder 403 is provided, this embodiment is not limited to this structure. Either one or both the precharge circuit 402 and the sense amplifier 401 may be provided on a side that faces the column decoder 403 with the memory cell array 400 provided therebetween. The precharge circuit 402 and the sense amplifier 401 may be merged into a single circuit.

Note that the memory element 300 may further include any of or all of a diode, a resistor, an arithmetic circuit (an arithmetic element), and a switch. As the arithmetic circuit (the arithmetic element), a buffer, an inverter, a NAND circuit, a NOR circuit, a three-state buffer, a clocked inverter, or the like can be used. For example, an analog switch, a transistor, or the like can be used as the switch. Alternatively, an arithmetic circuit (an arithmetic element) to which either one or both a clock signal and an inversion signal of the clock signal are input can be used as the switch.

(Structure of Memory Cell Array)

A more specific aspect of the memory cell array 400 is described.

(Structure 1 of Memory Cell Array)

The memory cell array 400 can include the plurality of storage elements 100a described in Embodiment 1 with reference to FIG. 1B arranged in matrix. For example, the memory cell array 400 illustrated in FIG. 3 includes m×n (m is a natural number of 2 or more and n is a natural number of 2 or more) storage elements (storage elements 100a (i, j) (i is a natural number of m or less and j is a natural number of n or less)). Each of the m×n storage elements (the storage elements 100a (i, j)) can be the storage element 100a illustrated in FIG. 1B. Each of the plurality of storage elements included in the memory cell array 400 is also referred to as a memory cell.

Figure 3:
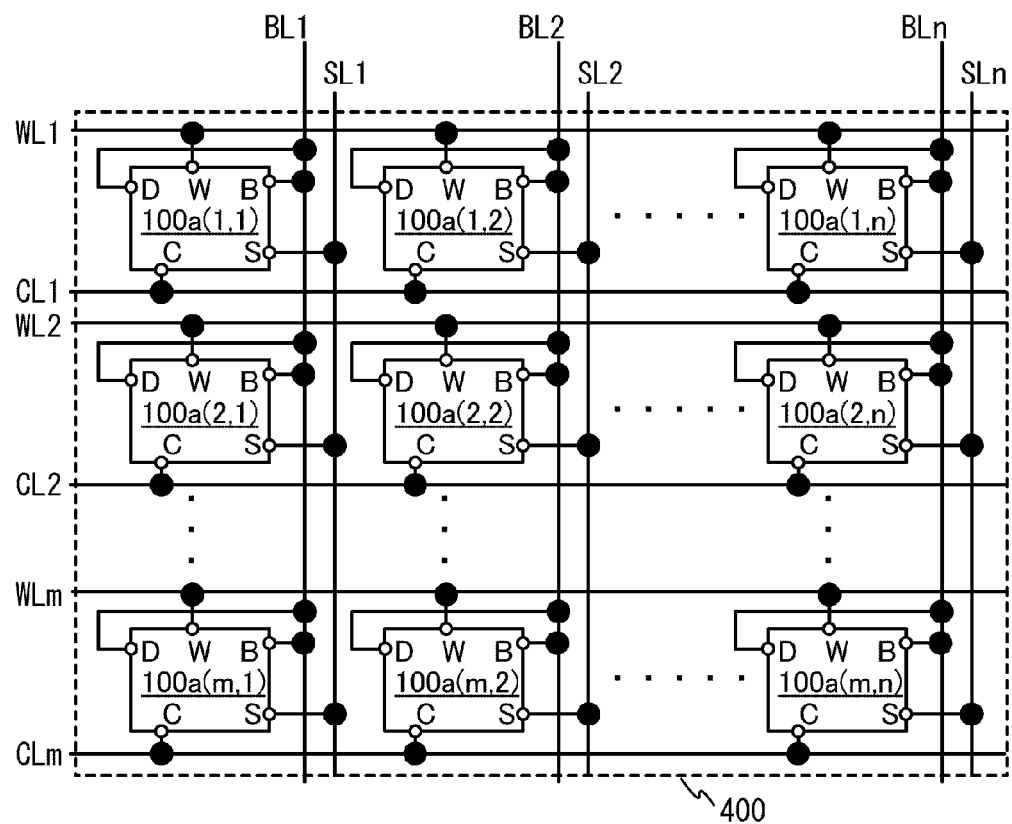
FIG. 3 is a circuit diagram of a memory cell array.

In FIG. 3, a wiring BLj that is electrically connected to the terminal B and the terminal D is used in common among the storage elements arranged in one column. For example, a wiring BL1 that is electrically connected to the terminal B and the terminal D is used in common among the storage elements arranged in a first column (the storage elements 100a (1, 1) to 100a (m, 1)). The wiring BLj can be referred to as a bit line.

In FIG. 3, a wiring SLj that is electrically connected to the terminal S is used in common among the storage elements arranged in one column. For example, a wiring SL1 that is electrically connected to the terminal S is used in common among the storage elements arranged in the first column (the storage elements 100a (1, 1) to 100a (m, 1)). Note that the wiring SLj that is electrically connected to the terminal S can be used in common among all the storage elements that are included in the memory cell array.

In FIG. 3, a wiring WLi that is electrically connected to the terminal W is used in common among the storage elements arranged in one row. For example, a wiring WL1 that is electrically connected to the terminal W is used in common among the storage elements arranged in a first row (the storage elements 100a (1, 1) to 100a (1, n)). The wiring WLi can be referred to as a write word line.

In FIG. 3, a wiring CLi that is electrically connected to the terminal C is used in common among the storage elements arranged in one row. For example, a wiring CL1 that is electrically connected to the terminal C is used in common among the storage elements arranged in the first row (the storage elements 100a (1, 1) to 100a (1, n)). The wiring CLi can be referred to as a read word line.

However, this embodiment is not limited to this structure. The plurality of wirings BLj and the plurality of wirings SLj may be provided in the storage elements arranged in one column, or the plurality of wirings WLi and the plurality of wirings CLi may be provided in the storage elements arranged in one row.

Each wiring can be used in common in the structure illustrated in FIG. 3. When each wiring is used in common, the memory cell array 400 can be miniaturized and highly integrated.

In the memory cell array 400 illustrated in FIG. 3, data is selectively written to the storage element (the storage element 100a (i, j)) in a row specified by a signal input to the wiring WLi. Specifically, the transistors 101 in the storage elements electrically connected to the wiring BLj other than the storage element to which data is written are turned off and the transistor 101 in the storage element to which data is written is turned on by a signal input to the wiring WLi. In this manner, the data is written to the specified storage element. Further, the data is selectively read from the storage element (the storage element 100a (i, j)) in a row specified by a signal input to the wiring CLi. Specifically, the transistors 102 in the storage elements electrically connected to the wiring BLj other than the storage element from which data is read are turned off (regardless of data retained) and the state of the transistor 102 in the storage element from which data is read is changed in accordance with the data (the signal potential)

retained. In this manner, the data is read from the specified storage element. Note that a method for writing and reading data to and from a specified storage element is similar to the method for driving the storage element 100a in the above embodiment; thus, description thereof is omitted.

(Structure 2 of Memory Cell Array)

The memory cell array 400 can include the plurality of storage elements 100a described in Embodiment 1 with reference to FIG. 1B arranged in matrix. For example, the memory cell array 400 illustrated in FIG. 6B includes m×n (m is a natural number of 2 or more and n is a natural number of 2 or more) storage elements (storage elements 100a (i, j) (i is a natural number of m or less and j is a natural number of n or less)). Each of the m×n storage elements (the storage elements 100a (i, j)) can be the storage element 100a illustrated in FIG. 1B. Each of the plurality of storage elements included in the memory cell array 400 is also referred to as a memory cell.

Figure 6A:
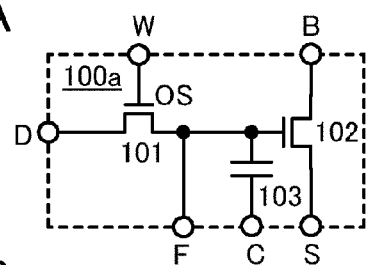
FIGS. 6A and 6B are circuit diagrams of a memory cell array.
Figure 6B:
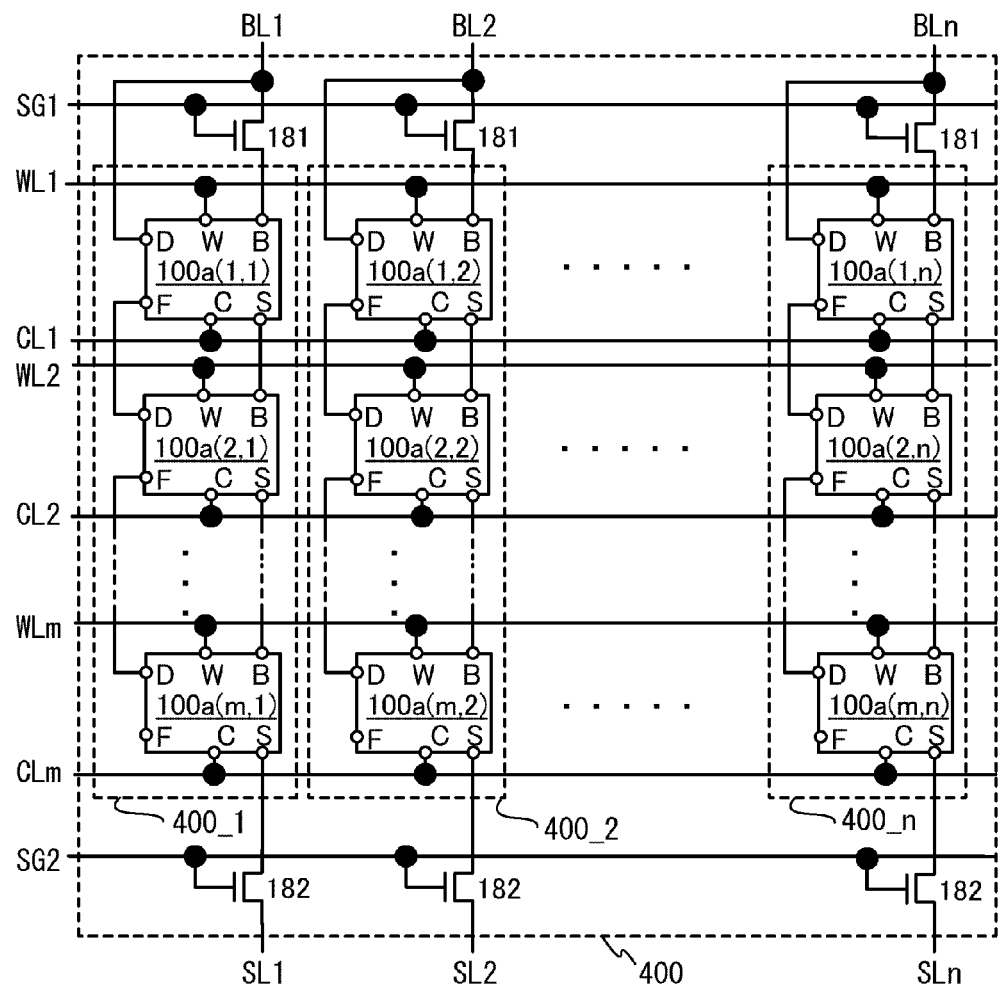

In the structure illustrated in FIG. 6B, in a storage element positioned at one of ends of a storage element group 400_j (the storage element 100a (1, j)), the terminal D is electrically connected to the wiring BLj, and the terminal B is electrically connected to the wiring BLj through a transistor 181 functioning as a switch. In a storage element positioned at the other end of the storage element group 400_j (the storage element 100a (m, j)), the terminal S is electrically connected to the wiring SLj through a transistor 182 functioning as a switch. Note that the transistor 182 may be eliminated and the terminal S may be directly connected to the wiring SLj in the storage element positioned at the other end of the storage element group 400_j (the storage element 100a (m, j)). In the storage elements other than the storage elements positioned at the ends of the storage element group 400_j, the terminal S of one of adjacent storage elements is electrically connected to the terminal B of the other of the adjacent storage elements, and a terminal F of the one of the adjacent storage elements is electrically connected to the terminal D of the other of the adjacent storage elements. Here, as illustrated in FIG. 6A, the terminal F is a terminal provided in a node that is electrically connected to the gate of the transistor 102. Thus, in the structure illustrated in FIG. 6B, the transistors 102 included in the storage element group 400_j can be regarded as being electrically connected in series and the transistors 101 included in the storage element group 400_j can be regarded as being electrically connected in series. The wiring BLj can be referred to as a bit line.

In FIG. 6B, the wiring WLi that is electrically connected to the terminal W is used in common among the storage elements arranged in one row. For example, the wiring WL1 that is electrically connected to the terminal W is used in common among the storage elements arranged in a first row (the storage elements 100a (1, 1) to 100a (1, n)). The wiring WLi can be referred to as a write word line.

In FIG. 6B, the wiring CLi that is electrically connected to the terminal C is used in common among the storage elements arranged in one row. For example, the wiring CL1 that is electrically connected to the terminal C is used in common among the storage elements arranged in the first row (the storage elements 100a (1, 1) to 100a (1, n)). The wiring CLi can be referred to as a read word line.

However, this embodiment is not limited to this structure. The plurality of wirings WLi and the plurality of wirings CLi may be provided in the storage elements arranged in one row.

Each wiring can be used in common in the structure illustrated in FIG. 6B. When each wiring is used in common, the memory cell array 400 can be miniaturized and highly integrated.

Note that although FIG. 6B illustrates the structure of the memory cell array 400 in which the storage element group 400_j is provided for one row, this embodiment is not limited to this structure. In the memory cell array 400, the storage element groups 400_j may be arranged in matrix.

In the memory cell array 400 illustrated in FIG. 6B, data is selectively written to the storage element (the storage element 100a (i, j)) in a row specified by a signal input to the wiring WLi. Specifically, data is sequentially written to the storage elements from the storage element on a side closer to the wiring SLj. The transistors 101 in the storage element to which data is written and all the storage elements provided on a side closer to the wiring BLj than the storage element are turned on by a signal input to the wiring WLi. Further, the transistors 101 in all the storage elements provided on a side closer to the wiring SLj than the storage element to which data is written are turned off by a signal input to the wiring WLi. In this manner, a signal potential corresponding to data is input from the wiring BLj to the storage element to which data is written. Note that either one or both the transistors 181 and 182 are off while data is written. Further, the data is selectively read from the storage element (the storage element 100a (i, j)) in a row specified by a signal input to the wiring CLi. Specifically, the transistors 102 in the storage elements electrically connected to the wiring BLj other than the storage element from which data is read are turned on (regardless of data retained) and the state of the transistor 102 in the storage element from which data is read is changed in accordance with the data (the signal potential) retained. Note that the transistors 181 and 182 are on while data is read. In this manner, the data is read from the specified storage element. Note that a method for writing and reading data to and from a specified storage element is similar to the method for driving the storage element 100a in the above embodiment; thus, description thereof is omitted.

(Structure 3 of Memory Cell Array)

The memory cell array 400 can include the plurality of storage elements 100b described in Embodiment 1 with reference to FIG. 1C arranged in matrix. For example, the memory cell array 400 illustrated in FIG. 4 includes m×n (m is a natural number of 2 or more and n is a natural number of 2 or more) storage elements (storage elements 100b (i, j) (i is a natural number of m or less and j is a natural number of n or less)). Each of the m×n storage elements (the storage elements 100b (i, j)) can be the storage element 100b illustrated in FIG. 1C. Each of the plurality of storage elements included in the memory cell array 400 is also referred to as a memory cell.

Figure 4:
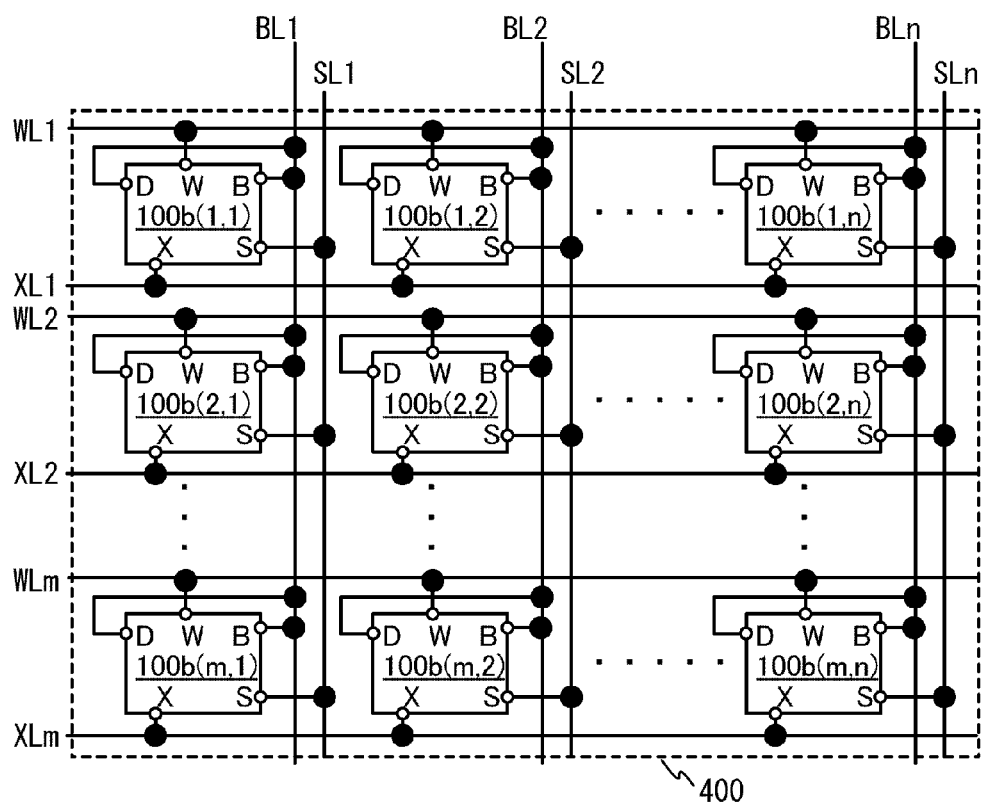
FIG. 4 is a circuit diagram of a memory cell array.

In FIG. 4, the wiring BLj that is electrically connected to the terminal B and the terminal D is used in common among the storage elements arranged in one column. For example, the wiring BL1 that is electrically connected to the terminal B and the terminal D is used in common among the storage elements arranged in a first column (the storage elements 100b (1, 1) to 100b (m, 1)). The wiring BLj can be referred to as a bit line.

In FIG. 4, the wiring SLj that is electrically connected to the terminal S is used in common among the storage elements arranged in one column. For example, the wiring SL1 that is electrically connected to the terminal S is used in common among the storage elements arranged in the first column (the storage elements 100b (1, 1) to 100b (m, 1)). Note that the wiring SLj that is electrically connected to the terminal S can be used in common among all the storage elements that are included in the memory cell array.

In FIG. 4, the wiring WLi that is electrically connected to the terminal W is used in common among the storage elements arranged in one row. For example, the wiring WL1 that is electrically connected to the terminal W is used in common among the storage elements arranged in a first row (the storage elements 100b (1, 1) to 100b (1, n)). The wiring WLi can be referred to as a write word line.

In FIG. 4, a wiring XLi that is electrically connected to the terminal X is used in common among the storage elements arranged in one row. For example, a wiring XL1 that is electrically connected to the terminal X is used in common among the storage elements arranged in the first row (the storage elements 100b (1, 1) to 100b (1, n)). The wiring XLi can be referred to as a read word line.

However, this embodiment is not limited to this structure. The plurality of wirings BLj and the plurality of wirings SLj may be provided in the storage elements arranged in one column, or the plurality of wirings WLi and the plurality of wirings XLi may be provided in the storage elements arranged in one row.

Each wiring can be used in common in the structure illustrated in FIG. 4. When each wiring is used in common, the memory cell array 400 can be miniaturized and highly integrated.

In the memory cell array 400 illustrated in FIG. 4, data is selectively written to the storage element (the storage element 100b (i, j)) in a row specified by a signal input to the wiring WLi. Specifically, the transistors 101 in the storage elements electrically connected to the wiring BLj other than the storage element to which data is written are turned off and the transistor 101 in the storage element to which data is written is turned on by a signal input to the wiring WLi. In this manner, the data is selectively written. Further, the data is selectively read from the storage element (the storage element 100b (i, j)) in a row specified by a signal input to the wiring XLi. Specifically, the transistors 141 in the storage elements electrically connected to the wiring BLj other than the storage element from which data is read are turned off and the transistor 141 in the storage element from which data is read is turned on. In this manner, the data is selectively read. Note that a method for writing and reading data to and from a specified storage element is similar to the method for driving the storage element 100b in the above embodiment; thus, description thereof is omitted.

(Structure 1 of Memory Cell Array)

The memory cell array 400 can include the plurality of storage elements 100c described in Embodiment 1 with reference to FIG. 1D arranged in matrix. For example, the memory cell array 400 illustrated in FIG. 5 includes m×n (m is a natural number of 2 or more and n is a natural number of 2 or more) storage elements (storage elements 100c (i, j) (i is a natural number of m or less and j is a natural number of n or less)). Each of the m×n storage elements (the storage elements 100c (i, j)) can be the storage element 100c illustrated in FIG. 1D. Each of the plurality of storage elements included in the memory cell array 400 is also referred to as a memory cell.

Figure 5:
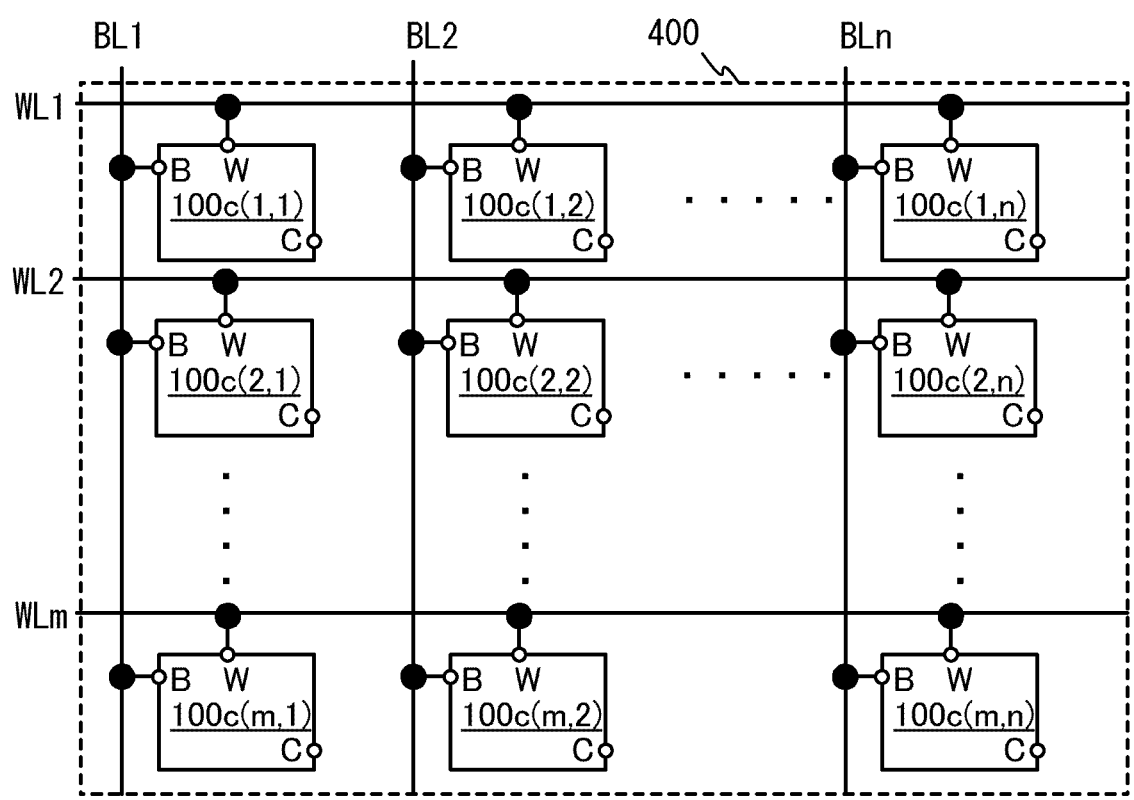
FIG. 5 is a circuit diagram of a memory cell array.

In FIG. 5, the wiring BLj that is electrically connected to the terminal B is used in common among the storage elements arranged in one column. For example, the wiring BL1 that is electrically connected to the terminal B is used in common among the storage elements arranged in a first column (the storage elements 100c (1, 1) to 100c (m, 1)). The wiring BLj can be referred to as a bit line.

In FIG. 5, the wiring WLi that is electrically connected to the terminal W is used in common among the storage elements arranged in one row. For example, the wiring WL1 that is electrically connected to the terminal W is used in common among the storage elements arranged in a first row (the storage elements 100c (1, 1) to 100c (1, n)). The wiring WLi can be referred to as a word line.

However, this embodiment is not limited to this structure. The plurality of wirings BLj may be provided in the storage elements arranged in one column, or the plurality of wirings WLi may be provided in the storage elements arranged in one row. In the m×n storage elements (the storage elements 100c (i, j)), the terminals C may be electrically connected to one electrode or one wiring or may be electrically connected to different electrodes or different wirings.

Each wiring can be used in common in the structure illustrated in FIG. 5. When each wiring is used in common, the memory cell array 400 can be miniaturized and highly integrated.

In the memory cell array 400 illustrated in FIG. 5, data is selectively written to and read from the storage element (the storage element 100c (i, j)) in a row specified by a signal input to the wiring WLi. Specifically, the transistors 104 in the storage elements other than the storage element to which data is written are turned off and the transistor 104 in the storage element to which data is written is turned on by a signal input to the wiring WLi; thus, the data is selectively written. Further, the transistors 104 in the storage elements other than the storage element from which data is read are turned off and the transistor 104 in the storage element from which data is read is turned on; thus, the data is selectively read. A method for writing and reading data to and from a specified storage element is similar to the method for driving the storage element 100c in the above embodiment; thus, description thereof is omitted.

(Variation of Memory Cell Array)

Note that in Structure 1 of the memory cell array, Structure 2 of the memory cell array, Structure 3 of the memory cell array, or Structure 4 of the memory cell array, the memory cell array may further include any of or all of a diode, a resistor, an arithmetic circuit (an arithmetic element), and a switch. As the arithmetic circuit (the arithmetic element), a buffer, an inverter, a NAND circuit, a NOR circuit, a three-state buffer, a clocked inverter, or the like can be used. For example, an analog switch, a transistor, or the like can be used as the switch. Alternatively, an arithmetic circuit (an arithmetic element) to which either one or both a clock signal and an inversion signal of the clock signal are input can be used as the switch.

Note that the memory element 300 can include memory capacitance for storing plural sets of configuration data corresponding to the state of the logic element 310 (the kind of logic operation performed by the look-up table 312 and a connection relation selected by the selection circuit 314), and given one set of configuration data can be selected from the plural sets of configuration data so that the data can be stored in the configuration memory 311. In that case, when one set of configuration data is stored in the storage elements provided in one row of the memory cell array 400, the one set of configuration data can be read by reading of the data from one row. Thus, the configuration time can be shortened.

(Structure of Sense Amplifier)

Next, a specific aspect of the structure of the sense amplifier 401 in FIG. 2 is described. The sense amplifier 401 can include a plurality of sense amplifiers. The sense amplifier can be provided per bit line provided in the memory cell array 400. The potential of the bit line can be amplified by the sense amplifier and can be detected from an output terminal of the sense amplifier. Here, the potential of the bit line is based on a signal potential held in a storage element that is electrically connected to the bit line and from which data is read. Thus, a signal output from the output terminal of the sense amplifier corresponds to data retained in the storage element from which data is read. In this manner, data retained in each storage element in the memory cell array 400 can be detected by the sense amplifier 401.

The sense amplifier can be formed using an inverter or a buffer. For example, the sense amplifier can be formed using a latch circuit (a latch sense amplifier). Alternatively, the sense amplifier can be formed using a comparator. For example, the sense amplifier can be formed using a differential amplifier (an operational amplifier).

In particular, in the case where the storage element 100c with the structure illustrated in FIG. 1D is used as the storage element included in the memory cell array 400, it is preferable to use a latch sense amplifier as the sense amplifier 401. The latch sense amplifier can amplify an input signal and can hold the amplified signal. Thus, even when electric charge corresponding to a signal potential held in the capacitor 105 in the storage element 100c is changed (damaged) at the time of reading data from the storage element 100c, a signal corresponding to the signal potential can be held in the latch sense amplifier and can be written to the storage element 100c again.

A more specific aspect of the sense amplifier 401 is described with reference to FIGS. 8A to 8D and FIGS. 9A to 9G.

(Structure 1 of Sense Amplifier)

Figure 8A:
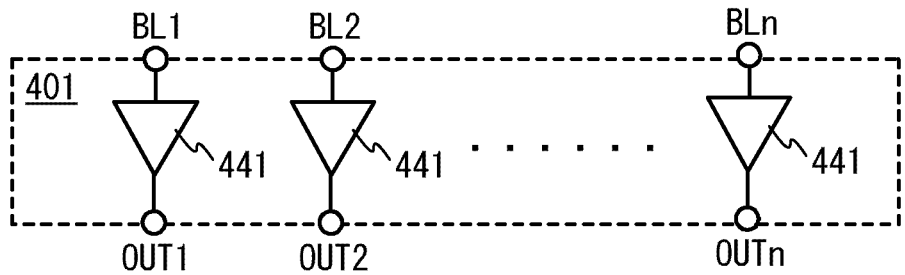
FIGS. 8A to 8D are circuit diagrams of a sense amplifier.

FIG. 8A illustrates an example of the sense amplifier 401 including buffers 441. The sense amplifier 401 includes the n buffers 441, and the n buffers 441 are provided in bit lines BL1 to BLn provided in the memory cell array 400. The potentials of the bit lines BL1 to BLn can be amplified by the n buffers 441 and can be output from output terminals OUT1 to OUTn. Here, the potential of the bit line is based on a signal potential held in a storage element that is electrically connected to the bit line and from which data is read. Thus, a signal output from the output terminal of the buffer 441 corresponds to data retained in the storage element from which data is read. In this manner, data retained in each storage element in the memory cell array 400 can be detected by the sense amplifier 401 including the n buffers 441.

(Structure 2 of Sense Amplifier)

Figure 8B:
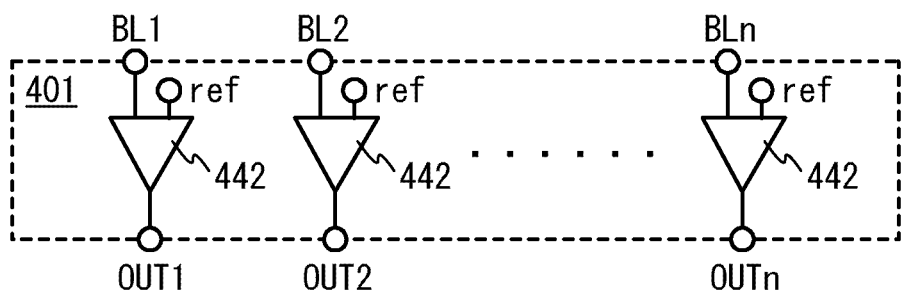

FIG. 8B illustrates an example of the sense amplifier 401 including comparators 442. The sense amplifier 401 includes the n comparators 442, and the n comparators 442 are provided in the bit lines BL1 to BLn provided in the memory cell array 400. The potentials of the bit lines BL1 to BLn can be compared to a reference potential (indicated by ref in FIG. 8B) by the n comparators 442 and the comparison results can be output from the output terminals OUT1 to OUTn. Here, the potential of the bit line is based on a signal potential held in a storage element that is electrically connected to the bit line and from which data is read. Thus, a signal output from the output terminal of the comparator 442 corresponds to data retained in the storage element from which data is read. In this manner, data retained in each storage element in the memory cell array 400 can be detected by the sense amplifier 401 including the n comparators 442.

(Structure 3 of Sense Amplifier)

Figure 8C:
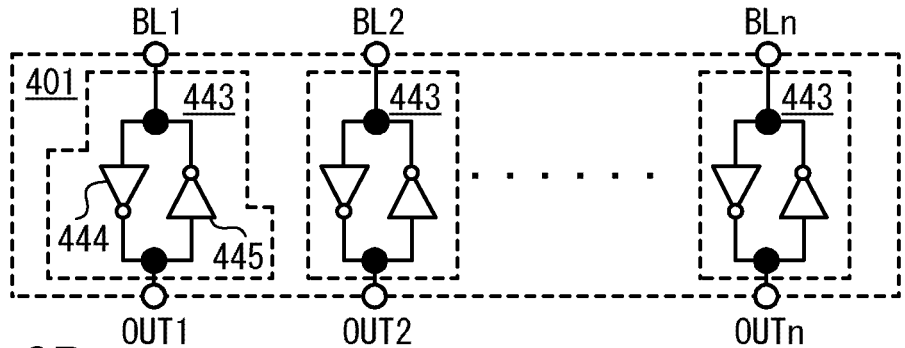
Figure 8D:
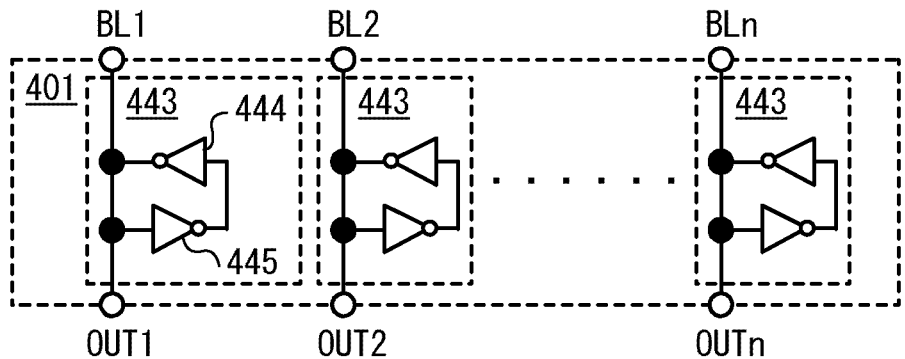

FIGS. 8C and 8D each illustrate an example of the sense amplifier 401 including latch circuits 443. The latch circuit 443 can be formed using an inverter 444 and an inverter 445, for example. The sense amplifier 401 includes the n latch circuits 443, and the n latch circuits 443 are provided in the bit lines BL1 to BLn provided in the memory cell array 400. The potentials of the bit lines BL1 to BLn can be amplified by the n latch circuits 443 and can be output from the output terminals OUT1 to OUTn. Here, the potential of the bit line is based on a signal potential held in a storage element that is electrically connected to the bit line and from which data is read. Thus, a signal (an amplified signal) output from the output terminal of the latch circuit 443 corresponds to data retained in the storage element from which data is read. In this manner, data retained in each storage element in the memory cell array 400 can be detected by the sense amplifier 401 including the n latch circuits 443.

Further, each of the n latch circuits 443 can hold an amplified signal. Thus, even when data is damaged at the time of reading the data from the storage element in the memory cell array 400, a corresponding signal can be held in the n latch circuits 443 and can be written to the storage element again.

For example, in the case where the storage element 100c with the structure illustrated in FIG. 1D is used as the storage element included in the memory cell array 400, it is preferable to use the sense amplifier 401 with the structure illustrated in FIG. 8C or 8D. Even when electric charge corresponding to a signal potential held in the capacitor 105 in the storage element 100c is changed (damaged) at the time of reading data from the storage element 100c, a signal corresponding to the signal potential can be held in the latch circuit 443 and can be written to the storage element 100c again. Note that the signal held in the latch circuit 443 can be written to the storage element 100c again through an arithmetic element such as an inverter. Further, when the drive capability of the plurality of inverters included in the latch circuit 443 can be set as appropriate, the latch circuit 443 can inhibit damage to the data at the time of reading the data from the storage element 100c from which data is read. The drive capability of the inverter can be increased when the channel width (the gate width) of a transistor included in the inverter is increased, and the drive capability can be decreased when the channel width (the gate width) is decreased. For example, when the drive capability of the inverter 445 included in the latch circuit 443 in FIG. 8C and the drive capability of the inverter 444 included in the latch circuit 443 in FIG. 8D are decreased, specifically, when the channel widths (the gate widths) of transistors included in these inverters are decreased, the latch circuits 443 can inhibit damage to the data at the time of reading the data from the storage element 100c from which data is read.

Since the sense amplifier 401 that includes the latch circuit 443 illustrated in FIG. 8C or 8D has a function of holding a signal as described above, the sense amplifier 401 can be used as a temporary storage circuit. For example, the sense amplifier 401 that includes the latch circuit 443 can be used as a circuit (e.g., a page buffer) for temporarily retaining data input from the outside of the memory element 300.

(Variation of Sense Amplifier)

Note that the sense amplifier may further include any of or all of a diode, a resistor, an arithmetic circuit (an arithmetic element), and a switch. As the arithmetic circuit (the arithmetic element), a buffer, an inverter, a NAND circuit, a NOR circuit, a three-state buffer, a clocked inverter, or the like can be used. For example, an analog switch, a transistor, or the like can be used as the switch. Alternatively, an arithmetic circuit (an arithmetic element) to which either one or both a clock signal and an inversion signal of the clock signal are input can be used as the switch.

Figure 9A:
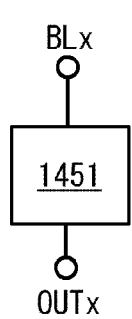
FIGS. 9A to 9G are circuit diagrams of a sense amplifier.

FIG. 9A schematically illustrates the structure of each sense amplifier in the sense amplifier 401 described with reference to FIGS. 8A to 8D. A sense amplifier 1451 corresponds to the buffer 441 in FIG. 8A, the comparator 442 in FIG. 8B, or the latch circuit 443 in FIG. 8C or 8D. The symbol BLx indicates any one of the bit lines BL1 to BLn, and the symbol OUTx indicates any one of the output terminals OUT1 to OUTn. A diode, a resistor, an arithmetic circuit (an arithmetic element), or a switch can be added to the sense amplifier with the structure in FIG. 9A.

Figure 9B:
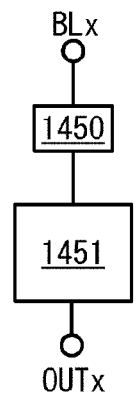

As illustrated in FIG. 9B, an element 1450 may be provided between the bit line BLx and the sense amplifier 1451. A switch can be used as the element 1450, for example.

Figure 9C:
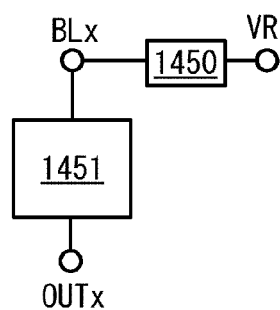

As illustrated in FIG. 9C, a terminal VR may be electrically connected to the bit line BLx through the element 1450. A switch, a resistor, or a diode can be used as the element 1450, for example.

Figure 9D:
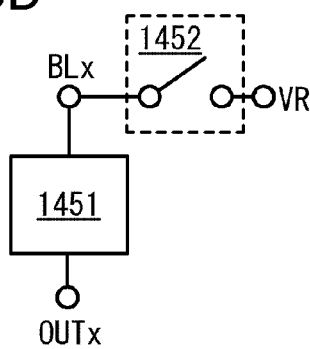

FIG. 9D is an example in which a switch 1452 is provided as the element 1450 in FIG. 9C. FIG. 9F is an example in which a transistor whose gate is supplied with a control signal PSW is used as the switch 1452. In the structure illustrated in FIG. 9D or 9F, when the switch 1452 is turned on by application of a predetermined potential to the terminal VR, the predetermined potential can be precharged to the bit line BLx. In this manner, the sense amplifier 401 can also be used as the precharge circuit 402.

Figure 9E:
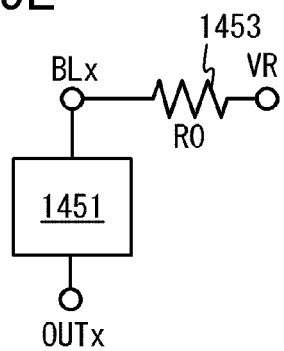
Figure 9F:
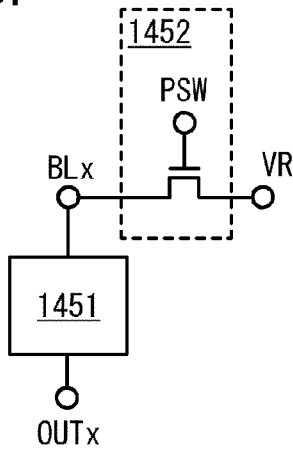
Figure 9G:
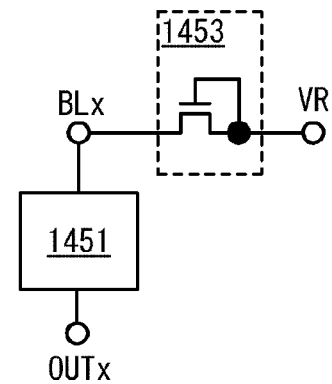

FIG. 9E is an example in which a load 1453 is provided as the element 1450 in FIG. 9C. FIG. 9G is an example in which a diode-connected transistor is used as the load 1453. In the structure illustrated in FIG. 9E or 9G, in the case where the transistor 102 is off by a signal potential held at the time of reading data from the storage element 100a illustrated in FIG. 1B or the storage element 100b illustrated in FIG. 1C, the potential of the terminal VR can be input to the sense amplifier.

(Structure of Precharge Circuit)

Figure 7:
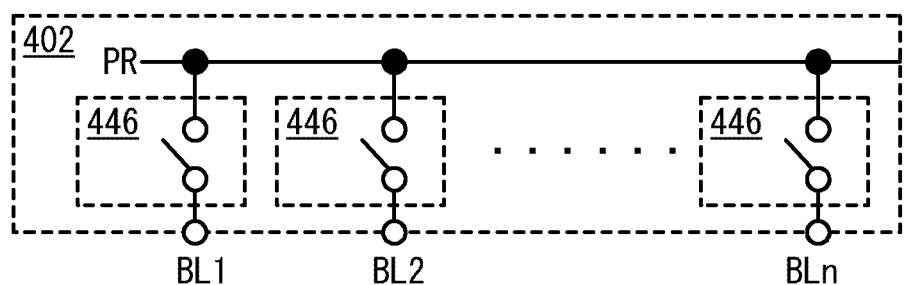
FIG. 7 is a circuit diagram of a precharge circuit.

Next, a specific aspect of the precharge circuit 402 in FIG. 2 is described with reference to FIG. 7. In FIG. 7, the precharge circuit 402 includes a precharge line PR and a plurality of switches 446. The switches 446 can be provided in the bit lines BL1 to BLn in the memory cell array 400. An electrical connection between each bit line and the precharge line PR is selected by each switch 446, and the potential (the precharge potential) of the precharge line PR can be input to each bit line. For example, an analog switch, a transistor, or the like can be used as the switch 446. Alternatively, an arithmetic circuit (an arithmetic element) to which either one or both a clock signal and an inversion signal of the clock signal are input can be used as the switch 446.

Note that the precharge circuit 402 may further include any of or all of a diode, a resistor, an arithmetic circuit (an arithmetic element), and a different switch. As the arithmetic circuit (the arithmetic element), a buffer, an inverter, a NAND circuit, a NOR circuit, a three-state buffer, a clocked inverter, or the like can be used.

The above is the description of variations of the memory element.

Note that one embodiment of the present invention can be a storage device whose structure is similar to the structure of the memory element or a semiconductor device including the storage device.

This embodiment can be combined with any of the other embodiments as appropriate.

Embodiment 3

In this embodiment, one aspect of the configuration memory 311 included in the logic element 310 is described. The configuration memory 311 can be formed using, for example, a latch circuit or a capacitor.

Figure 10A:
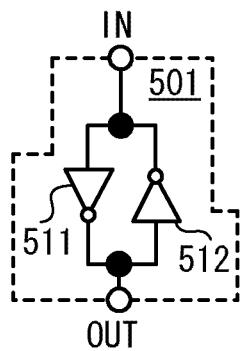
FIGS. 10A to 10C are circuit diagrams of storage elements included in a configuration memory.
Figure 10B:
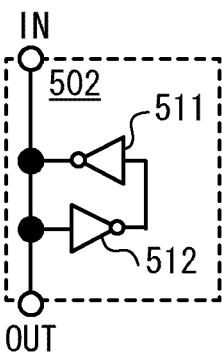

FIGS. 10A and 10B each illustrate an example in which a storage element 501 or a storage element 502 includes a latch circuit as the storage element included in the configuration memory 311. The latch circuit can be formed using an inverter 511 and an inverter 512. Data input from an input terminal IN is retained in the storage element 501 and the storage element 502, and is output from an output terminal OUT.

In the case where the configuration memory 311 is formed using the storage element 501 or the storage element 502, the configuration memory 311 can be used as the sense amplifier 401 or part of the sense amplifier 401. In other words, the structure of the configuration memory 311 and the structure of the sense amplifier 401 can be used in common partly or entirely.

Figure 10C:
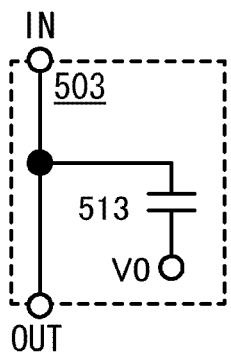

FIG. 10C is an example in which a storage element 503 including a capacitor 513 is used as the storage element included in the configuration memory 311. The storage element 503 can store data when a signal potential input is held in one of a pair of electrodes of the capacitor 513. In this manner, data input from the input terminal IN is retained in the storage element 503 and is output from the output terminal OUT. Note that a potential V0 can be applied to the other of the pair of electrodes of the capacitor 513. The potential V0 can be a low power supply potential (e.g., a ground potential).

Note that when a specific word line or a specific read word line is continuously selected in the memory element 300, configuration data can be continuously input from the memory element 300 to the configuration memory 311. At this time, in the case where the storage element 503 including the capacitor 513 is used as the storage element included in the configuration memory 311, the capacitance of the capacitor 513 can be decreased. For example, it is possible not to provide the configuration memory 311 by using parasitic capacitance instead of the capacitor 513. Thus, the logic element 310 can be further miniaturized.

In particular, the memory element 300 stores plural sets of configuration data corresponding to the state of the logic element (the kind of logic operation performed by the look-up table 312 and a connection relation selected by the selection circuit 314) and selects given one set of configuration data from the plurality of sets of configuration data so that the data can be stored in the configuration memory 311. Here, when an output terminal of the memory element 300 (corresponding to an output terminal of the sense amplifier) is provided to correspond to a storage element in the configuration memory 311 and one set of configuration data is stored in the memory elements 300 in one row, predetermined configuration can be performed by reading of data from the memory elements 300 in one row. In this manner, the configuration can be performed at high speed and dynamic configuration can be easily performed.

This embodiment can be combined with any of the other embodiments as appropriate.

Embodiment 4

In this embodiment, one aspect of the look-up table 312 included in the logic element 310 is described. The look-up table 312 can be formed using a plurality of multiplexers. Further, configuration data can be input to any of input terminals and control terminals of the plurality of multiplexers.

Figure 11A:
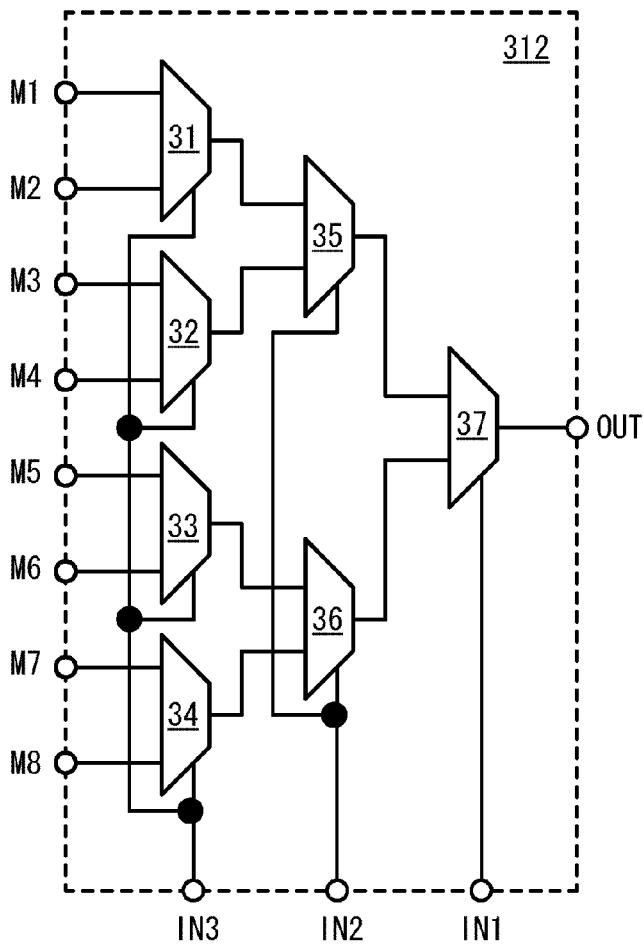
FIGS. 11A to 11C are circuit diagrams of a look-up table.

FIG. 11A illustrates one aspect of the look-up table 312 included in the logic element 310.

In FIG. 11A, the look-up table 312 is formed using seven two-input multiplexers (a multiplexer 31, a multiplexer 32, a multiplexer 33, a multiplexer 34, a multiplexer 35, a multiplexer 36, and a multiplexer 37). Input terminals of the multiplexers 31 to 34 correspond to input terminals M1 to M8 of the look-up table 312. Control terminals of the multiplexers 31 to 34 are electrically connected to each other and correspond to an input terminal IN3 of the look-up table 312.

Output terminals of the multiplexers 31 and 32 are electrically connected to two input terminals of the multiplexer 35. Output terminals of the multiplexers 33 and 34 are electrically connected to two input terminals of the multiplexer 36. Control terminals of the multiplexers 35 and 36 are electrically connected to each other and correspond to an input terminal IN2 of the look-up table 312. Output terminals of the multiplexers 35 and 36 are electrically connected to two input terminals of the multiplexer 37. A control terminal of the multiplexer 37 corresponds to an input terminal IN1 of the look-up table 312. An output terminal of the multiplexer 37 corresponds to an output terminal OUT of the look-up table 312.

When configuration data is input from each storage element in the configuration memory 311 to any of the input terminals M1 to M8 and IN1 to IN3, the kind of arithmetic processing performed by the look-up table 312 can be specified.

Figure 11B:
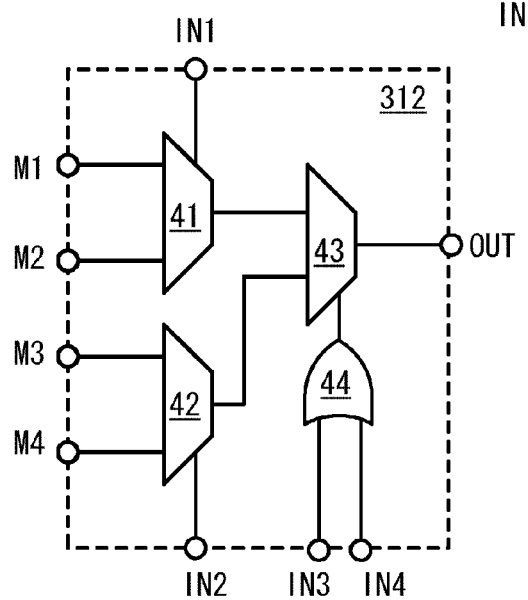
Figure 11C:
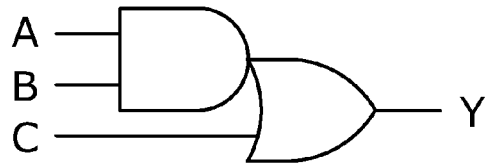

For example, in the case where data ("0", "1", "0", "1", "0", "1", "1", and "1") is input to the input terminals M1 to M8 of the look-up table 312 in FIG. 11A, the function of an equivalent circuit illustrated in FIG. 11C can be obtained. Here, "A", "B", and "C" are assigned to the input terminals IN1 to IN3, and "Y" is assigned to the output terminal OUT.

FIG. 11B illustrates another aspect of the look-up table 312 included in the logic element 310.

In FIG. 11B, the look-up table 312 is formed using three two-input multiplexers (a multiplexer 41, a multiplexer 42, and a multiplexer 43) and a two-input OR circuit 44. Input terminals of the multiplexers 41 and 42 correspond to the input terminals M1 to M4 of the look-up table 312. A control terminal of the multiplexer 41 corresponds to the input terminal IN1 of the look-up table 312. A control terminal of the multiplexer 42 corresponds to the input terminal IN2 of the look-up table 312. Output terminals of the multiplexers 41 and 42 are electrically connected to two input terminals of the multiplexer 43. Two input terminals of the OR circuit 44 correspond to the input terminal IN 3 and an input terminal IN4 of the look-up table 312, and an output of the OR circuit 44 is input to a control terminal of the multiplexer 43. An output terminal of the multiplexer 43 corresponds to the output terminal OUT of the look-up table 312.

When configuration data is input from each storage element in the configuration memory 311 to any of the input terminals M1 to M4 and IN1 to IN4, the kind of arithmetic processing performed by the look-up table 312 can be specified.

For example, in the case where data ("0", "1", "0", "0", and "0") is input to the input terminals M1, M3, M4, IN2, and IN4 of the look-up table 312 in FIG. 11B, the function of the equivalent circuit illustrated in FIG. 11C can be obtained. Here, "A", "B", and "C" are assigned to the input terminals IN1, M2, and IN3, and "Y" is assigned to the output terminal OUT.

Note that although FIGS. 11A and 11B each illustrate the example of the look-up table formed using two-input multiplexers, this embodiment is not limited thereto. It is possible to use a look-up table formed using multiplexers each having three or more inputs.

Note that the look-up table may further include any of or all of a diode, a resistor, an arithmetic circuit (an arithmetic element), and a switch in addition to the multiplexers. As the arithmetic circuit (the arithmetic element), a buffer, an inverter, a NAND circuit, a NOR circuit, a three-state buffer, a clocked inverter, or the like can be used. For example, an analog switch, a transistor, or the like can be used as the switch. Alternatively, an arithmetic circuit (an arithmetic element) to which either one or both a clock signal and an inversion signal of the clock signal are input can be used as the switch.

Although the case where three-input and one-output arithmetic processing as illustrated in FIG. 11C is performed using the look-up table 312 illustrated in FIG. 11A or FIG. 11B, this embodiment is not limited thereto. When the look-up table and configuration data to be input are determined as appropriate, arithmetic processing having four or more inputs and two or more outputs can be performed.

This embodiment can be combined with any of the other embodiments as appropriate.

Embodiment 5

In this embodiment, one aspect of the selection circuit 314 included in the logic element 310 is described. The selection circuit 314 can be formed using a multiplexer or a switch. Further, configuration data can be input to a control terminal of the multiplexer or the switch.

Figure 12A:
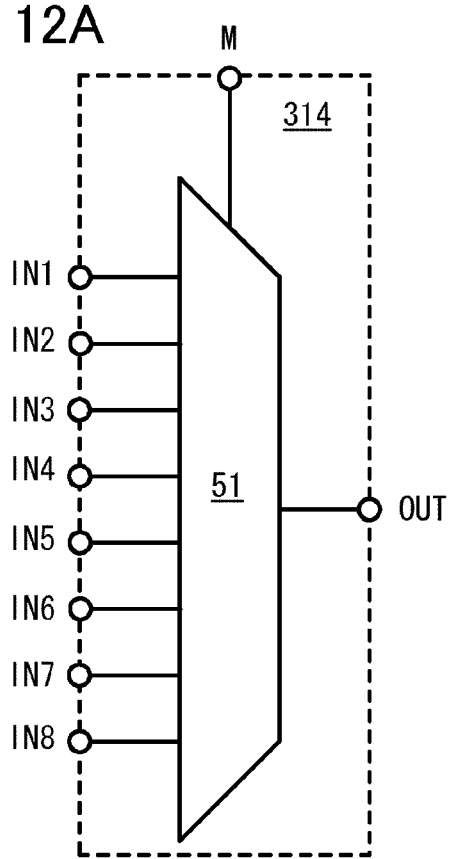
FIGS. 12A and 12B are circuit diagrams of a selection circuit.

FIG. 12A illustrates one aspect of the selection circuit 314 included in the logic element 310.

In FIG. 12A, the selection circuit 314 is formed using an eight-input multiplexer 51. When 3-bit configuration data is input to a control terminal M, any of signals input to input terminals IN1 to IN8 of the multiplexer 51 can be selectively output from an output terminal OUT.

Note that although FIG. 12A illustrates the example of the selection circuit formed using an eight-input multiplexer, this embodiment is not limited thereto. It is possible to use a selection circuit formed using a multiplexer having nine or more inputs. The selection circuit may further include any of or all of a diode, a resistor, an arithmetic circuit (an arithmetic element), and a switch in addition to the multiplexer. As the arithmetic circuit (the arithmetic element), a buffer, an inverter, a NAND circuit, a NOR circuit, a three-state buffer, a clocked inverter, or the like can be used. For example, an analog switch, a transistor, or the like can be used as the switch. Alternatively, an arithmetic circuit (an arithmetic element) to which either one or both a clock signal and an inversion signal of the clock signal are input can be used as the switch.

Figure 12B:
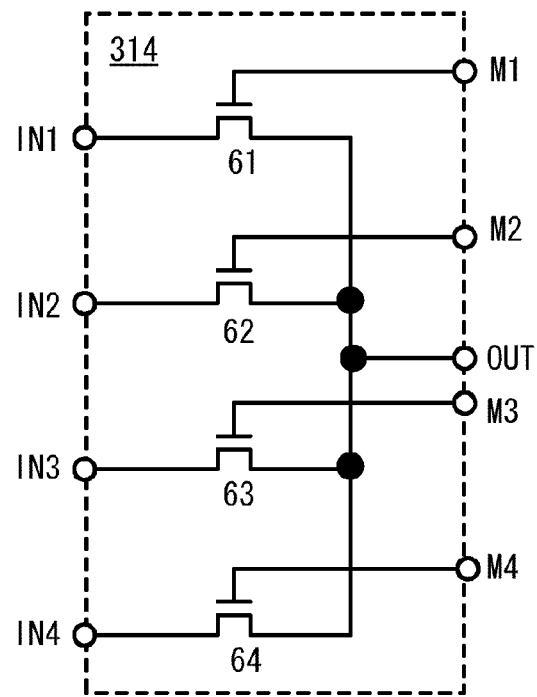

FIG. 12B illustrates another aspect of the selection circuit 314 included in the logic element 310.

In FIG. 12B, the selection circuit 314 includes transistors 61 to 64 each functioning as a switch. A gate of the transistor 61 is electrically connected to the terminal M1. A gate of the transistor 62 is electrically connected to the terminal M2. A gate of the transistor 63 is electrically connected to the terminal M3. A gate of the transistor 64 is electrically connected to the terminal M4. The input terminal IN1 is electrically connected to the output terminal OUT through a source and a drain of the transistor 61. The input terminal IN2 is electrically connected to the output terminal OUT through a source and a drain of the transistor 62. The input terminal IN3 is electrically connected to the output terminal OUT through a source and a drain of the transistor 63. The input terminal IN4 is electrically connected to the output terminal OUT through a source and a drain of the transistor 64. In FIG. 12B, when 4-bit configuration data is input to the input terminals M1 to M4, any of signals input to the input terminals IN1 to IN4 can be selectively output from the output terminal OUT. Note that when two or more of the transistors 61 to 64 are turned on at the same time, two or more of the input terminals IN1 to IN4 can be electrically connected to each other.

Note that given elements each functioning as a switch can be used as a substitute for the transistors 61 to 64.

Although FIG. 12B illustrates the example of the four-input and one-output selection circuit, this embodiment is not limited thereto. It is possible to use a selection circuit having five or more inputs and two or more outputs. The selection circuit may further include any of or all of a multiplexer, a diode, a resistor, an arithmetic circuit (an arithmetic element), and a switch. As the arithmetic circuit (the arithmetic element), a buffer, an inverter, a NAND circuit, a NOR circuit, a three-state buffer, a clocked inverter, or the like can be used. For example, an analog switch, a transistor, or the like can be used as the switch. Alternatively, an arithmetic circuit (an arithmetic element) to which either one or both a clock signal and an inversion signal of the clock signal are input can be used as the switch.

This embodiment can be combined with any of the other embodiments as appropriate.

Embodiment 6

A method for forming the storage element 100a illustrated in FIG. 1B is described. Note that a method for forming the terminal B and the terminal D that are electrically connected to each other is described. The transistor 102 is a transistor whose channel is formed using silicon. In this embodiment, a method for forming the storage element 100a is described giving the transistor 102, the transistor 101 whose channel is formed in an oxide semiconductor layer, and the capacitor 103 as examples.

Note that the transistor 101 and the transistor 102 in the storage element 100b can be formed in a manner similar to that of the transistor 101 and the transistor 102 in the storage element 100a. The transistor 104 and the capacitor 105 in the storage element 100c can be formed in a manner similar to that of the transistor 101 and the capacitor 103 in the storage element 100a.

Further, other transistors and other capacitors included in the programmable LSI can be formed in a manner similar to that of the transistor 101, the transistor 102, and the capacitor 103 in the storage element 100a. For example, transistors and the like included in the configuration memory, the look-up table, the selection circuit, and the register in the logic element can be formed in a manner similar to that of the transistor 101, the transistor 102, and the capacitor 103.

Figure 13A:
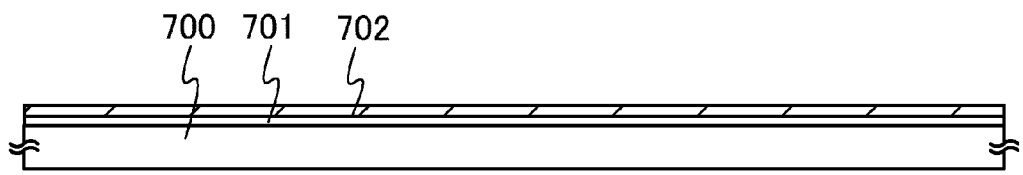
FIGS. 13A to 13D illustrate steps of forming a storage element.

First, as illustrated in FIG. 13A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where the temperature of the heat treatment to be performed later is high, a glass substrate whose strain point is 730° C. or higher is preferably used as a glass substrate.

In this embodiment, an example in which the semiconductor film 702 is formed using single crystal silicon is given below as the method for forming the transistor 102. Note that a specific example of a method for forming the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately 1 to 500 N/cm$^2$, preferably 11 to 20 N/cm$^2$ is applied to part of the bond substrate and part of the substrate 700 so that the substrates are attached to each other. When the pressure is applied to part of the bond substrate and part of the substrate 700, bonding between the bond substrate and the insulating film 701 starts from the parts, which results in bonding of the entire surface where the bond substrate and the insulating film 701 are in close contact with each other. After that, heat treatment is performed, so that microvoids that exist in the fragile layer are combined, and the volume of the microvoids is increased. Accordingly, a single crystal semiconductor film which is part of the bond substrate is separated from the bond substrate along the fragile layer. The temperature of the heat treatment is set so as not to exceed the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not etched to have a predetermined shape or may be added to the semiconductor film 702 which is etched to have a predetermined shape. Alternatively, the impurity element for controlling the threshold voltage may be added to the bond substrate. Alternatively, the impurity element may be added to the bond substrate in order to roughly control the threshold voltage, and the impurity element may be further added to the semiconductor film which is not etched to have a predetermined shape or the semiconductor film 702 which is etched to have a predetermined shape in order to finely control the threshold voltage.

Note that although the single crystal semiconductor film is used in this embodiment, the present invention is not limited to this structure. For example, a polycrystalline, microcrystalline, or amorphous semiconductor film which is formed over the insulating film 701 by vapor deposition may be used. Alternatively, the semiconductor film may be crystallized by a known technique. As a known crystallization technique, laser crystallization using a laser beam or crystallization using a catalytic element can be used. Alternatively, crystallization using a catalytic element and laser crystallization can be used in combination. When a heat-resistant substrate such as a quartz substrate is used, crystallization combined with thermal crystallization using an electrically heated oven, lamp heating crystallization using infrared light, crystallization using a catalytic element, or high-temperature heating at approximately 950° C. may be used.

Figure 13B:
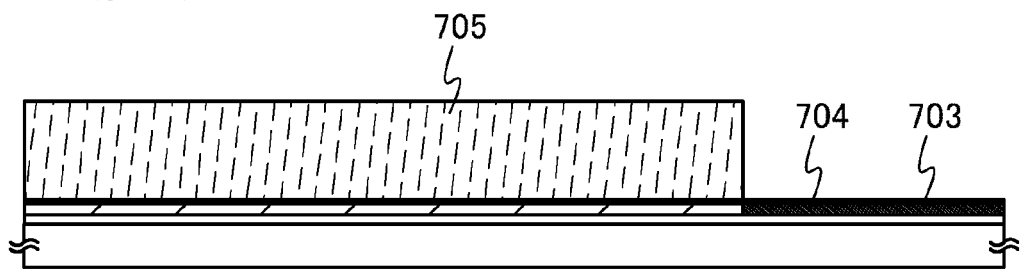

Next, as illustrated in FIG. 13B, a gate insulating film 703 is formed over the semiconductor film 702. Then, a mask 705 is formed over the gate insulating film 703 and an impurity element imparting conductivity is added to part of the semiconductor film 702, so that an impurity region 704 is formed.

The gate insulating film 703 can be formed by oxidation or nitriding of a surface of the semiconductor film 702 by high-density plasma treatment, heat treatment, or the like. The high-density plasma treatment is performed using, for example, a mixed gas of a rare gas such as He, Ar, Kr, or Xe;

and oxygen, nitrogen oxide, ammonia, nitrogen, hydrogen, or the like. In that case, when plasma is excited by introduction of microwaves, plasma with a low electron temperature and high density can be generated. By oxidation or nitriding of the surface of the semiconductor film with oxygen radicals (including OH radicals in some cases) or nitrogen radicals (including NH radicals in some cases) generated by such high-density plasma, an insulating film with a thickness of 1 to 20 nm, preferably 5 to 10 nm can be formed to be in contact with the semiconductor film. For example, nitrous oxide ($N_2O$) is diluted with Ar by 1 to 3 times (flow rate) and a microwave (2.45 GHz) electric power of 3 to 5 kW is applied with a pressure of 10 to 30 Pa so that the oxidation or nitriding of the surface of the semiconductor film 702 is performed. By this treatment, an insulating film with a thickness of 1 to 10 nm (preferably 2 to 6 nm) is formed. Further, nitrous oxide ($N_2O$) and silane ($SiH_4$) are introduced and a microwave (2.45 GHz) electric power of 3 to 5 kW is applied with a pressure of 10 to 30 Pa so that a silicon oxynitride film is formed by vapor deposition, thereby forming a gate insulating film. With a combination of solid-phase reaction and vapor deposition, a gate insulating film having low interface state density and high withstand voltage can be formed.

The oxidation or nitriding of the semiconductor film by the high-density plasma treatment proceeds by solid-phase reaction. Thus, interface state density between the gate insulating film 703 and the semiconductor film 702 can be extremely low. Further, by direct oxidation or nitriding of the semiconductor film 702 by high-density plasma treatment, variation in the thickness of the insulating film to be formed can be suppressed. Further, in the case where the semiconductor film has crystallinity, by oxidation of the surface of the semiconductor film by solid-phase reaction by high-density plasma treatment, crystal grain boundaries can be prevented from being locally oxidized at fast speed. Thus, a uniform gate insulating film with low interface state density can be formed. Variations in the characteristics of a transistor whose gate insulating film partly or entirely includes an insulating film formed by high-density plasma treatment can be suppressed.

The gate insulating film 703 may be formed using a single layer or a stack of layers of a film including silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$ (x>0, y>0)) to which nitrogen is added, hafnium aluminate ($HfAl_xO_y$, (x>0, y>0)) to which nitrogen is added, or the like by plasma-enhanced CVD, sputtering, or the like.

Note that in this specification, an oxynitride is a substance which includes more oxygen than nitrogen, and a nitride oxide is a substance which includes more nitrogen than oxygen.

The thickness of the gate insulating film 703 can be, for example, 1 to 100 nm, preferably 10 to 50 nm. In this embodiment, a single-layer insulating film containing silicon oxide is formed as the gate insulating film 703 by plasma-enhanced CVD.

Figure 13C:
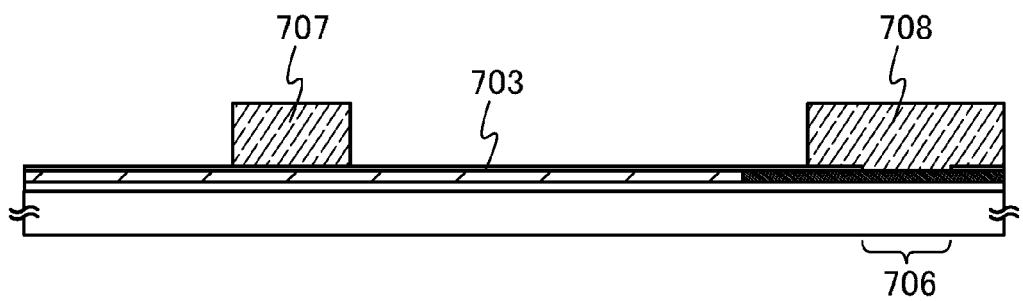

Then, after the mask 705 is removed, part of the gate insulating film 703 is removed as illustrated in FIG. 13C and an opening 706 is formed in a region overlapping with the impurity region 704 by etching or the like. After that, a gate electrode 707 and a conductive film 708 are formed.

A conductive film is formed to cover the opening 706 and then is processed into a predetermined shape, so that the gate electrode 707 and the conductive film 708 can be formed. The conductive film 708 is in contact with the impurity region 704 in the opening 706. The conductive film can be formed by CVD, sputtering, vapor deposition, spin coating, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing the metal as its main component or a compound containing the metal may be used. Alternatively, the conductive film may be formed using a semiconductor such as polycrystalline silicon doped with an impurity element such as phosphorus which imparts conductivity to the semiconductor film.

Note that although the gate electrode 707 and the conductive film 708 are formed using a single-layer conductive film in this embodiment, this embodiment is not limited to this structure. The gate electrode 707 and the conductive film 708 may be formed of a plurality of stacked conductive films.

As a combination of two conductive films, tantalum nitride or tantalum can be used for a first conductive film and tungsten can be used for a second conductive film. As well as the example, any of the following combination can be used: tungsten nitride and tungsten; molybdenum nitride and molybdenum; aluminum and tantalum; aluminum and titanium; and the like. Since tungsten and tantalum nitride have high heat resistance, heat treatment for thermal activation can be performed in a step performed after the two conductive films are formed. Alternatively, as the combination of the two conductive films, for example, nickel silicide and silicon doped with an impurity element which imparts n-type conductivity, tungsten silicide and silicon doped with an impurity element which imparts n-type conductivity, or the like can be used.

In the case of a three-layer structure in which three conductive films are stacked, a layered structure of a molybdenum film, an aluminum film, and a molybdenum film is preferably used.

A light-transmitting oxide conductive film of indium oxide, indium oxide-tin oxide, indium oxide-zinc oxide, zinc oxide, zinc aluminum oxide, zinc aluminum oxynitride, zinc gallium oxide, or the like can be used as the gate electrode 707 and the conductive film 708.

Alternatively, the gate electrode 707 and the conductive film 708 may be selectively formed by a droplet discharge method without the use of a mask. A droplet discharge method is a method for forming a predetermined pattern by discharge or ejection of a droplet containing a predetermined composition from an orifice, and includes an inkjet method in its category.

In addition, the gate electrode 707 and the conductive film 708 may be formed by forming a conductive film, and the conductive film is etched by inductively coupled plasma (ICP) etching under appropriately controlled conditions (e.g., the amount of electric power applied to a coiled electrode layer, the amount of electric power applied to an electrode layer on the substrate side, and the electrode temperature on the substrate side) to have a desired tapered shape. Further, an angle and the like of the tapered shape may be controlled by the shape of a mask. Note that for an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 13D:
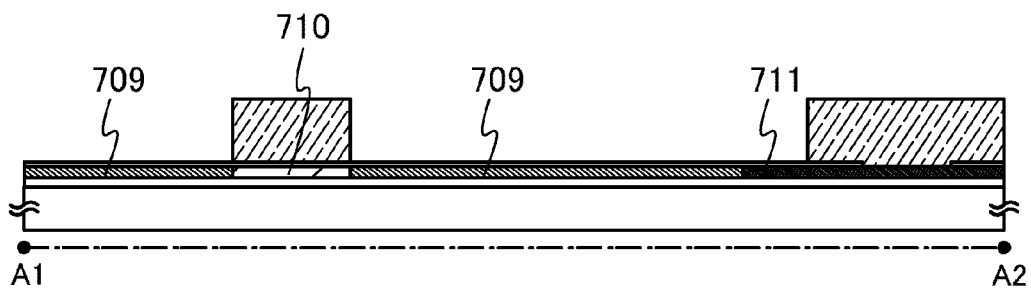

Next, as illustrated in FIG. 13D, when an impurity element which imparts one conductivity is added to the semiconductor film 702 with the gate electrode 707 and the conductive film 708 used as masks, a channel formation region 710 overlapping with the gate electrode 707, a pair of impurity regions 709 sandwiching the channel formation region 710, and an impurity region 711 obtained by further adding an impurity element to part of the impurity region 704 are formed in the semiconductor film 702.

In this embodiment, the case where an impurity element which imparts p-type conductivity (e.g., boron) is added to the semiconductor film 702 is described.

Figure 14A:
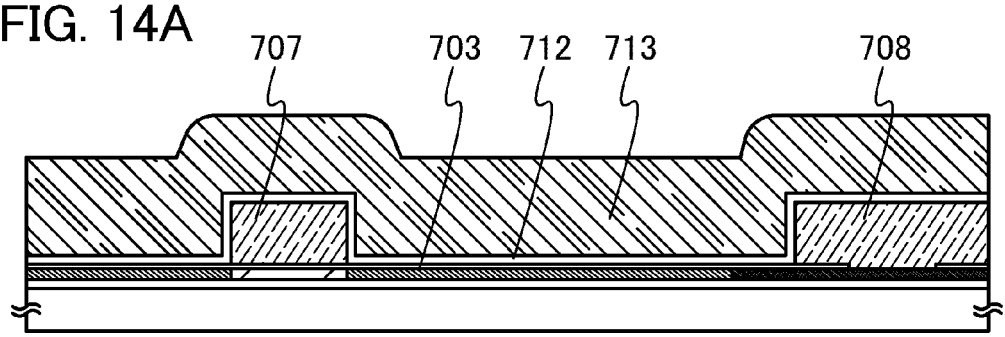
FIGS. 14A to 14C illustrate steps of forming a storage element.

Next, as illustrated in FIG. 14A, insulating films 712 and 713 are formed to cover the gate insulating film 703, the gate electrode 707, and the conductive film 708. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, the insulating films 712 and 713 are preferably formed using a low dielectric constant (low-k) material because capacitance due to overlapping of electrodes or wirings can be sufficiently reduced. Note that a porous insulating film including such a material may be employed as the insulating films 712 and 713. Since the porous insulating film has lower dielectric constant than a dense insulating layer, parasitic capacitance due to electrodes or wirings can be further reduced.

In this embodiment, an example in which silicon oxynitride is used for the insulating film 712 and silicon nitride oxide is used for the insulating film 713 is described. In addition, in this embodiment, although an example in which the insulating films 712 and 713 are formed over the gate electrode 707 and the conductive film 708, in the present invention, only one insulating film may be formed over the gate electrode 707 and the conductive film 708, or a plurality of insulating films of three or more layers may be stacked.

Figure 14B:
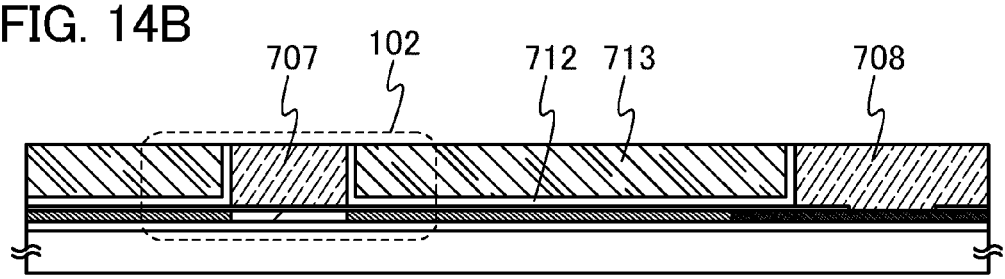

Next, as illustrated in FIG. 14B, the insulating films 712 and 713 are subjected to chemical mechanical polishing (CMP) or etching, so that surfaces of the gate electrode 707 and the conductive film 708 are exposed. Note that in order to improve the characteristics of the transistor 101 which is formed later, surfaces of the insulating films 712 and 713 are preferably flattened as much as possible.

Through the above steps, the transistor 102 can be formed.

Figure 14C:
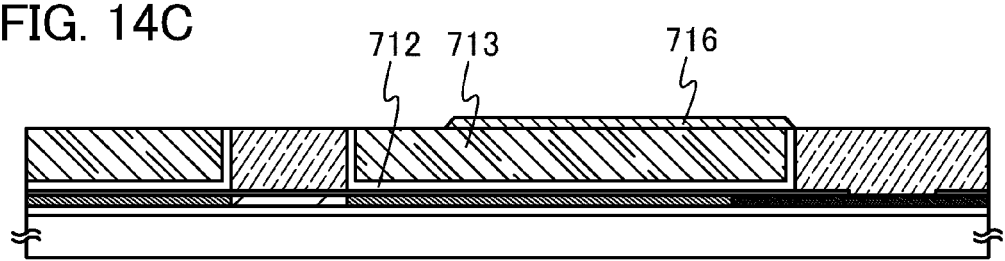

Next, a method for forming the transistor 101 is described. First, as illustrated in FIG. 14C, an oxide semiconductor layer 716 is formed over the insulating film 712 or the insulating film 713.

The oxide semiconductor layer 716 can be formed by processing an oxide semiconductor film formed over the insulating films 712 and 713 into a desired shape. The thickness of the oxide semiconductor film is 2 to 200 nm, preferably 3 to 50 nm, more preferably 3 to 20 nm. The oxide semiconductor film is deposited by sputtering using an oxide semiconductor as a target. Alternatively, the oxide semiconductor film can be formed by sputtering in a rare gas (e.g., argon) atmosphere, an oxygen atmosphere, or a mixed atmosphere of a rare gas (e.g., argon) and oxygen.

Note that before the oxide semiconductor film is deposited by sputtering, dust on surfaces of the insulating films 712 and 713 is preferably removed by reverse sputtering in which an argon gas is introduced and plasma is generated. The reverse sputtering is a method in which, without application of voltage to a target side, an RF power source is used for application of voltage to a substrate side in an argon atmosphere and plasma is generated in the vicinity of the substrate so that a substrate surface is modified. Note that nitrogen, helium, or the like may be used instead of the argon atmosphere. Alternatively, an argon atmosphere to which oxygen, nitrous oxide, or the like is added may be used. Alternatively, an argon atmosphere to which chlorine, carbon tetrafluoride, or the like is added may be used.

The oxide semiconductor layer preferably contains at least indium (In) or zinc (Zn). In particular, oxide semiconductor layer preferably contains In and Zn. As a stabilizer for reducing variation in electrical characteristics of a transistor including the oxide semiconductor layer, the oxide semiconductor layer preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained. For example, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Here, for example, an In—Ga—Zn-based oxide semiconductor means an oxide semiconductor containing indium (In), gallium (Ga), and zinc (Zn), and there is no limitation on the composition ratio.

For the oxide semiconductor layer, a thin film represented by a chemical formula of $InMO_3(ZnO)_m$ (m>0, where m is not an integer) can be used. Here, M denotes one or more metal elements selected from Ga, Al, Mn, or Co. As the oxide semiconductor, a material represented by $In_3SnO_5(ZnO)_n$ (n>0, where n is an integer) may be used.

In the case where an In—Zn-based material is used for the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, when a target used for deposition of an In—Zn-based oxide semiconductor has a composition ratio of In:Zn:O=X:Y:Z in an atomic ratio, Z>1.5X+Y.

In this embodiment, a 30-nm-thick In—Ga—Zn-based oxide semiconductor thin film which is obtained by sputtering using a target including indium (In), gallium (Ga), and zinc (Zn) is used as the oxide semiconductor film. A target with a composition ratio of metals, In:Ga:Zn=1:1:0.5, In:Ga:Zn=1:1:1, or In:Ga:Zn=1:1:2 can be used as the target, for example. The filling rate of the target including In, Ga, and Zn is higher than or equal to 90% and lower than or equal to 100%, preferably higher than or equal to 95% and lower than 100%. With the use of the target with a high filling rate, a dense oxide semiconductor film is formed.

In this embodiment, the oxide semiconductor film is deposited in such a manner that the substrate is held in a treatment chamber kept in a reduced pressure state, moisture remaining in the treatment chamber is removed, a sputtering gas from which hydrogen and moisture are removed is introduced, and the target is used. The substrate temperature may be 100 to 600° C., preferably 200 to 400° C. during deposition. By deposition of the oxide semiconductor film while the substrate is heated, the concentration of impurities included in the deposited oxide semiconductor film can be lowered. In addition, damage by sputtering can be reduced. In order to remove moisture remaining in the treatment chamber, an adsorption vacuum pump is preferably used. For example, a cryopump, an ion pump, or a titanium sublimation pump is preferably used. A turbo pump to which a cold trap is added may be used as an exhaustion means. For example, a hydrogen atom, a compound containing a hydrogen atom, such as water (preferably a compound containing a carbon atom), and the like are exhausted from the treatment chamber with the use of a cryopump. Thus, the concentration of impurities contained in the oxide semiconductor film deposited in the treatment chamber can be lowered.

As an example of the deposition condition, the following condition is employed: the distance between the substrate and the target is 100 mm, the pressure is 0.6 Pa, the direct current (DC) power is 0.5 kW, and the atmosphere is an oxygen atmosphere (the proportion of the oxygen flow rate is 100%). Note that it is preferable that pulsed direct-current (DC) power be used because dust generated during deposition can be reduced and the film thickness can be uniform.

Further, when the leakage rate of the treatment chamber of the sputtering apparatus is set lower than or equal to $1\times10^{-10}$ Pa×m³/s, entry of impurities such as alkali metal or hydride into the oxide semiconductor film that is being formed by sputtering can be reduced. Furthermore, with the use of the adsorption vacuum pump as an evacuation system, counter flow of impurities such as alkali metal, a hydrogen atom, a hydrogen molecule, water, a hydroxyl group, or hydride from the evacuation system can be reduced.

When the purity of the target is set to 99.99% or higher, alkali metal, a hydrogen atom, a hydrogen molecule, water, a hydroxyl group, hydride, or the like mixed into the oxide semiconductor film can be reduced. In addition, with the use of the target, the concentration of an alkali metal such as lithium, sodium, or potassium can be reduced in the oxide semiconductor film.

Note that in order that hydrogen, a hydroxyl group, and moisture be contained in the oxide semiconductor film as little as possible, it is preferable that an impurity such as hydrogen or moisture that is adsorbed on the substrate 700 be eliminated and exhausted by preheating of the substrate 700 over which the insulating films 712 and 713 are formed in a preheating chamber of a sputtering apparatus, as pretreatment for deposition. The temperature of the preheating is 100 to 400° C., preferably 150 to 300° C. As an exhaustion means provided in the preheating chamber, a cryopump is preferable. Note that the preheating treatment can be omitted. This preheating may be similarly performed on the substrate 700 over which conductive films 719 and 720 are formed before the formation of a gate insulating film 721.

Note that etching for forming the oxide semiconductor layer 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching, parallel plate reactive ion etching (RIE) or inductively coupled plasma (ICP) etching can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, organic acid such as citric acid or oxalic acid, or the like can be used. In this embodiment, ITO-07N (produced by KANTO CHEMICAL CO., INC.) is used.

A resist mask for forming the oxide semiconductor layer 716 may be formed by an inkjet method. When the resist mask is formed by an inkjet method, a photomask is not used; thus, manufacturing cost can be reduced.

Note that it is preferable that reverse sputtering be performed before the formation of a conductive film in a subsequent step so that resist residues and the like that attach onto surfaces of the oxide semiconductor layer 716 and the insulating films 712 and 713 are removed.

Note that the oxide semiconductor film deposited by sputtering or the like contains a large amount of moisture or hydrogen (including a hydroxyl group) as an impurity in some cases. Moisture or hydrogen easily forms a donor level and thus serve as an impurity in the oxide semiconductor. Thus, in one embodiment of the present invention, in order to reduce impurities such as moisture or hydrogen in the oxide semiconductor film (in order to perform dehydration or dehydrogenation), the oxide semiconductor layer 716 is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring down laser spectroscopy (CRDS) method).

By performing heat treatment on the oxide semiconductor layer 716, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, treatment can be performed even at a temperature higher than the strain point of a glass substrate.

In this embodiment, an electric furnace that is one of heat treatment apparatuses is used.

Note that the heat treatment apparatus is not limited to an electric furnace, and may be provided with a device for heating an object by thermal conduction or thermal radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. An inert gas which does not react with an object by heat treatment, such as nitrogen or a rare gas (e.g., argon), is used as the gas.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

Note that it has been pointed out that an oxide semiconductor is insensitive to impurities, there is no problem when a considerable amount of metal impurities is contained in the film, and soda-lime glass which contains a large amount of alkali metal such as sodium and is inexpensive can be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. Alkali metal is not an element included in an oxide semiconductor and thus is an impurity. Alkaline earth metal is also an impurity in the case where alkaline earth metal is not included in an oxide semiconductor. Alkali metal, in particular, Na becomes Na+ when an insulating film which is in contact with an oxide semiconductor layer is an oxide and Na diffuses into the insulating film. In addition, in the oxide semiconductor layer, Na cuts or enters a bond between metal and oxygen which are included in an oxide semiconductor. As a result, for example, deterioration of characteristics of a transistor, such as a normally-on state of the transistor due to shift of the threshold voltage in a negative direction, or a decrease in mobility, occurs. Variation in characteristics also occurs. Such deterioration of characteristics of the transistor and variation in characteristics due to the impurity remarkably appear when the concentration of hydrogen in the oxide semiconductor layer is extremely low. Thus, when the concentration of hydrogen in the oxide semiconductor layer is $1 \times 10^{18}/cm^3$ or lower, preferably $1 \times 10^{17}/cm^3$ or lower, the concentration of the impurity is preferably lowered. Specifically, the measurement value of a Na concentration by secondary ion mass spectrometry is preferably $5 \times 10^{16}/cm^3$ or less, more preferably $1 \times 10^{16}/cm^3$ or less, still more preferably $1 \times 10^{15}/cm^3$ or less. Similarly, the measurement value of a Li concentration is preferably $5 \times 10^{15}/cm^3$ or less, more preferably $1 \times 10^{15}/cm^3$ or less. Similarly, the measurement value of a K concentration is preferably $5 \times 10^{15}/cm^3$ or less, more preferably $1 \times 10^{15}/cm^3$ or less.

Through the above steps, the concentration of hydrogen in the oxide semiconductor layer 716 can be lowered. In addition, the heat treatment at a temperature of lower than or equal to the glass transition temperature makes it possible to form an oxide semiconductor layer with extremely low carrier density and a wide band gap. Thus, the transistor can be formed using a large substrate, so that mass productivity can be increased. The heat treatment can be performed at any time after the oxide semiconductor layer is deposited.

Note that the oxide semiconductor layer may be either amorphous or crystalline. The oxide semiconductor layer may be either single crystal or non-single-crystal. In the case of non-single-crystal, the oxide semiconductor layer may be either amorphous or polycrystalline. Further, the oxide semiconductor may have an amorphous structure including a crystalline portion or may be non-amorphous. For the oxide semiconductor layer, it is possible to use an oxide including a crystal with c-axis alignment (also referred to as c-axis aligned crystal (CAAC)) that has a phase having a triangular, hexagonal, regular triangular, or regular hexagonal atomic order when seen from the direction perpendicular to the a-b plane and in which metal atoms are arranged in a layered manner or metal atoms and oxygen atoms are arranged in a layered manner when seen from the direction perpendicular to the c-axis direction.

An oxide semiconductor film including CAAC can be formed by sputtering. In order to obtain an oxide including CAAC by sputtering, it is important to form hexagonal crystals in an initial stage of deposition of an oxide semiconductor film and to cause crystal growth from the hexagonal crystals as cores. In order to achieve this, it is preferable that the distance between the target and the substrate be made longer (e.g., approximately 150 to 200 mm) and a substrate heating temperature be 100 to 500° C., preferably 200 to 400° C., more preferably 250 to 300° C. In addition, the deposited oxide semiconductor film is subjected to heat treatment at a temperature higher than the substrate heating temperature during the deposition, so that micro defects in the film and defects at the interface of a stacked layer can be repaired.

In the oxide including CAAC, metal atoms and oxygen atoms are bonded in an orderly manner in comparison with an amorphous oxide semiconductor. In other words, in the case where an oxide semiconductor is amorphous, the coordination number of oxygen atoms in a metal atom might vary between metal atoms, but the coordination number of metal atoms in a metal atom is substantially constant in the oxide including CAAC. Thus, microscopic defects of oxygen can be reduced and instability and charge transfer due to attachment and detachment of hydrogen atoms (including hydrogen ions) or alkali metal atoms can be reduced.

Consequently, when a transistor is formed using an oxide semiconductor film including CAAC, the amount of change in the threshold voltage of the transistor that occurs after light irradiation and a bias-temperature (BT) stress test are performed on the transistor can be reduced. Accordingly, a transistor with stable electrical characteristics can be formed.

Figure 15A:
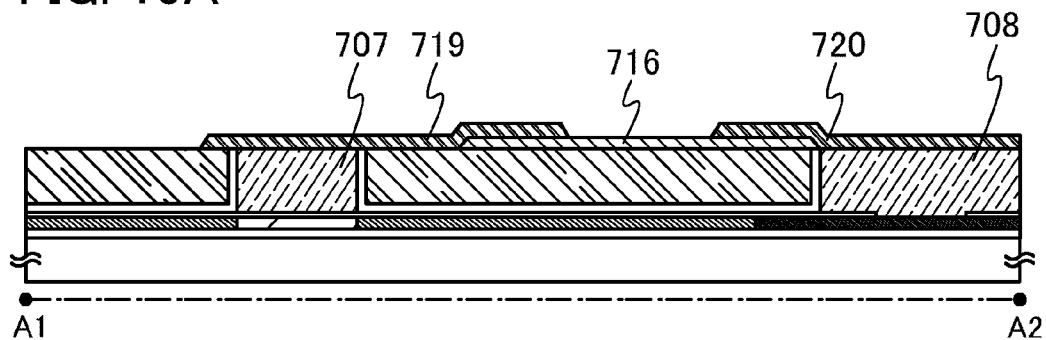
FIGS. 15A to 15C illustrate steps of forming a storage element.

Next, as illustrated in FIG. 15A, the conductive film 719 which is in contact with the gate electrode 707 and the oxide semiconductor layer 716 and the conductive film 720 which is in contact with the conductive film 708 and the oxide semiconductor layer 716 are formed. The conductive films 719 and 720 function as a source and drain electrodes.

Specifically, the conductive films 719 and 720 can be formed in such a manner that a conductive film is formed to cover the gate electrode 707 and the conductive film 708 by sputtering or vacuum vapor deposition and then is processed into a predetermined shape.

As the conductive film which serves as the conductive films 719 and 720, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive films 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesion with an oxide film. Thus, for the conductive films 719 and 720, a layered structure is employed in which a conductive film including a Cu—Mg—Al alloy, a Mo—Ti alloy, Ti, or Mo is used for a lower layer and a conductive film including Cu is used for an upper layer. Consequently, the adhesion between an insulating film which is an oxide film and the conductive films 719 and 720 can be increased.

For the conductive film which serves as the conductive films 719 and 720, a conductive metal oxide may be used. As the conductive metal oxide, indium oxide, tin oxide, zinc oxide, indium oxide-tin oxide, indium oxide-zinc oxide, or the conductive metal oxide material containing silicon or silicon oxide can be used.

In the case where heat treatment is performed after the formation of the conductive film, the conductive film preferably has heat resistance high enough to withstand the heat treatment.

Note that each material and etching conditions are adjusted as appropriate so that the oxide semiconductor layer 716 is not removed as much as possible during etching of the conductive film. Depending on the etching conditions, an exposed portion of the oxide semiconductor layer 716 is partly etched, so that a groove (a depression portion) is formed in some cases.

In this embodiment, a titanium film is used as the conductive film. Thus, the conductive film can be selectively etched by wet etching using a solution (an ammonia hydrogen peroxide mixture) containing ammonia and hydrogen peroxide water. Specifically, an ammonia hydrogen peroxide mixture in which oxygenated water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

Note that in order to reduce the number of photomasks used in a photolithography process and to reduce the number of processes, an etching process may be performed using a multi-tone mask through which light is transmitted to have a plurality of intensities. A resist mask formed using a multi-tone mask has a plurality of thicknesses and can be changed in shape by etching; thus, the resist mask can be used in a plurality of etching processes for processing films into different patterns. Accordingly, a resist mask corresponding to at least two or more kinds of different patterns can be formed by one multi-tone mask. Thus, the number of exposure masks and the number of corresponding photolithography processes can be reduced, so that the process can be simplified.

Further, an oxide conductive film functioning as a source and drain regions may be provided between the oxide semiconductor layer 716 and the conductive films 719 and 720 functioning as a source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, etching for forming the oxide conductive film and etching for forming the conductive films 719 and 720 may be performed concurrently.

With provision of the oxide conductive film functioning as a source and drain regions, resistance between the oxide semiconductor layer 716 and the conductive films 719 and 720 can be lowered, so that the transistor can operate at high speed. In addition, with provision of the oxide conductive film functioning as a source and drain regions, the withstand voltage of the transistor can be increased.

Next, plasma treatment may be performed using a gas such as $N_2O$, $N_2$, or Ar. With this plasma treatment, water and the like which attach to a surface of the oxide semiconductor layer exposed are removed. Alternatively, plasma treatment may be performed using a mixture gas of oxygen and argon.

Figure 15B:
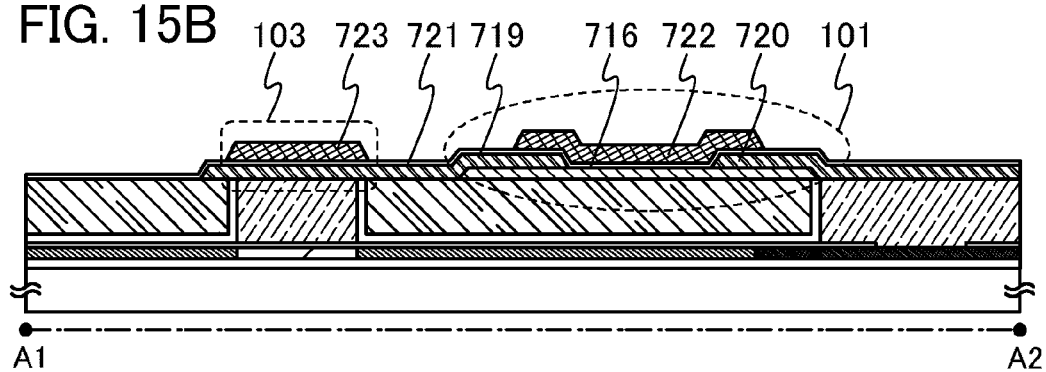

After the plasma treatment, as illustrated in FIG. 15B, the gate insulating film 721 is formed to cover the conductive films 719 and 720 and the oxide semiconductor layer 716. Then, a gate electrode 722 is formed over the gate insulating film 721 to overlap with the oxide semiconductor layer 716, and a conductive film 723 is formed over the conductive film 719 to overlap with the conductive film 719.

The gate insulating film 721 can be formed using a material and a layered structure which are similar to those of the gate insulating film 703. Note that the gate insulating film 721 preferably includes impurities such as moisture or hydrogen as little as possible, and the gate insulating film 721 may be formed using a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen, such as a silicon oxide film or a silicon oxynitride film, is formed on a side which is closer to the oxide semiconductor layer 716 than the insulating film having a high barrier property. Then, the insulating film having a high barrier property is formed to overlap with the conductive films 719 and 720 and the oxide semiconductor layer 716 with the insulating film having low proportion of nitrogen sandwiched therebetween. When the insulating film having a high barrier property is used, impurities such as moisture or hydrogen can be prevented from entering the oxide semiconductor layer 716, the gate insulating film 721, or the interface between the oxide semiconductor layer 716 and another insulating film and the vicinity thereof. In addition, the insulating film having low proportion of nitrogen, such as a silicon oxide film or a silicon oxynitride film, is formed so as to be in contact with the oxide semiconductor layer 716, so that the insulating film having a high barrier property can be prevented from being in direct contact with the oxide semiconductor layer 716.

In this embodiment, the gate insulating film 721 with a structure in which a 100-nm-thick silicon nitride film formed by sputtering is stacked over a 200-nm-thick silicon oxide film formed by sputtering is formed. The substrate temperature during deposition is in the range of room temperature to 300° C., and is 100° C. in this embodiment.

After the gate insulating film 721 is formed, heat treatment may be performed. The heat treatment is performed in a nitrogen atmosphere, ultra-dry air, or a rare gas (e.g., argon or helium) atmosphere preferably at 200 to 400° C., for example, 250 to 350° C. It is preferable that the content of water in the gas be 20 ppm or lower, preferably 1 ppm or lower, more preferably 10 ppb or lower. In this embodiment, for example, heat treatment is performed at 250° C. for 1 hour in a nitrogen atmosphere. Alternatively, RTA treatment for a short time at a high temperature may be performed before the formation of the conductive films 719 and 720 in a manner similar to that of the heat treatment performed on the oxide semiconductor layer for reduction of moisture or hydrogen. Even when oxygen defects are generated in the oxide semiconductor layer 716 by the heat treatment performed on the oxide semiconductor layer 716 by performing heat treatment after provision of the gate insulating film 721 containing oxygen, oxygen is supplied to the oxide semiconductor layer 716 from the gate insulating film 721. By the supply of oxygen to the oxide semiconductor layer 716, oxygen defects that serve as donors can be reduced in the oxide semiconductor layer 716 and the stoichiometric ratio can be satisfied. The oxide semiconductor layer 716 preferably contains oxygen whose composition exceeds the stoichiometric composition. As a result, the oxide semiconductor layer 716 can be made substantially intrinsic and variation in electrical characteristics of the transistor due to oxygen defects can be reduced; thus, electrical characteristics can be improved. The timing of this heat treatment is not particularly limited as long as it is after the formation of the gate insulating film 721. When this heat treatment serves as heat treatment in another step (e.g., heat treatment during formation of a resin film or heat treatment for lowering the resistance of a transparent conductive film), the oxide semiconductor layer 716 can be made substantially intrinsic without the increase in the number of steps.

Alternatively, the oxygen defects that serve as donors in the oxide semiconductor layer 716 may be reduced by subjecting the oxide semiconductor layer 716 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably 6N (99.9999%) or higher, more preferably 7N (99.99999%) or higher (that is, the impurity concentration in oxygen is 1 ppm or lower, preferably 0.1 ppm or lower).

Alternatively, oxygen may be added to the oxide semiconductor layer 716 by ion implantation, ion doping, or the like so that oxygen defects that serve as donors are reduced. For example, oxygen made to be plasma with a microwave of 2.45 GHz may be added to the oxide semiconductor layer 716.

The gate electrode 722 and the conductive film 723 can be formed in such a manner that a conductive film is formed over the gate insulating film 721 and then is etched. The gate electrode 722 and the conductive film 723 can be formed using a material and a layered structure which are similar to those of the gate electrode 707 and the conductive films 719 and 720.

The thickness of each of the gate electrode 722 and the conductive film 723 is 10 to 400 nm, preferably 100 to 200 nm In this embodiment, after a 150-nm-thick conductive film for the gate electrode is formed by sputtering using a tungsten target, the conductive film is processed into a desired shape by etching, so that the gate electrode 722 and the conductive film 723 are formed. A resist mask may be formed by an inkjet method. When the resist mask is formed by an inkjet method, a photomask is not used; thus, manufacturing cost can be reduced.

Through the above steps, the transistor 101 is formed.

Note that the transistor 101 is not limited to a transistor whose channel is formed in an oxide semiconductor layer, and it is possible to use a transistor that includes a semiconductor material whose band gap is wider than that of silicon and whose intrinsic carrier density is lower than that of silicon in a channel formation region. As such a semiconductor material, for example, silicon carbide, gallium nitride, or the like can be used instead of an oxide semiconductor. With a channel formation region including such a semiconductor material, a transistor whose off-state current is extremely low can be obtained.

Note that a portion where the conductive film 719 and the conductive film 723 overlap with each other with the gate insulating film 721 provided therebetween corresponds to the capacitor 103.

Although the transistor 101 is described as a single-gate transistor, a multi-gate transistor including a plurality of channel formation regions can be formed when the plurality of gate electrodes 714 which are electrically connected are included when needed.

Note that an insulating film which is in contact with the oxide semiconductor layer 716 (in this embodiment, corresponding to the gate insulating film 721) may be formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing an element that belongs to Group 13 for the insulating film which is in contact with the oxide semiconductor layer, the state of an interface with the oxide semiconductor layer can be kept well.

An insulating material containing an element that belongs to Group 13 is an insulating material containing one or more elements that belong to Group 13. Examples of the insulating material containing an element that belongs to Group 13 include gallium oxide, aluminum oxide, aluminum gallium oxide, and gallium aluminum oxide. Here, aluminum gallium oxide is a material whose content of aluminum is larger than the content of gallium in an atomic percent, and gallium aluminum oxide is a material whose content of gallium is larger than or equal to the content of aluminum in an atomic percent.

For example, in the case where an insulating film is formed in contact with an oxide semiconductor layer containing gallium, when a material containing gallium oxide is used for the insulating film, favorable characteristics can be kept at the interface between the oxide semiconductor layer and the insulating film. For example, when the oxide semiconductor layer and the insulating film containing gallium oxide are provided in contact with each other, pileup of hydrogen at the interface between the oxide semiconductor layer and the insulating film can be reduced. Note that a similar effect can be obtained in the case where an element that belongs to the same group as a constituent element of the oxide semiconductor is used for the insulating film. For example, it is effective to form an insulating film with the use of a material containing aluminum oxide. Aluminum oxide does not easily transmit water. Thus, it is preferable to use the material including aluminum oxide in order to prevent water from entering the oxide semiconductor layer.

The insulating film which is in contact with the oxide semiconductor layer 716 preferably contains oxygen in a proportion higher than that in the stoichiometric composition, by heat treatment in an oxygen atmosphere or oxygen doping. Oxygen doping is addition of oxygen to a bulk. Note that the term "bulk" is used in order to clarify that oxygen is added not only to a surface of a thin film but also to the inside of the thin film. In addition, the term "oxygen doping" includes "oxygen plasma doping" in which oxygen which is made to be plasma is added to a bulk. The oxygen doping may be performed by ion implantation or ion doping.

For example, in the case where the insulating film which is in contact with the oxide semiconductor layer 716 is formed using gallium oxide, the composition of gallium oxide can be set to be $Ga_2O_X$ ($X=3+\alpha$, $0<\alpha<1$) by heat treatment in an oxygen atmosphere or oxygen doping.

In the case where the insulating film which is in contact with the oxide semiconductor layer 716 is formed using aluminum oxide, the composition of aluminum oxide can be set to be $Al_2O_X$ ($X=3+\alpha$, $0<\alpha<1$) by heat treatment in an oxygen atmosphere or oxygen doping.

In the case where the insulating film which is in contact with the oxide semiconductor layer 716 is formed using gallium aluminum oxide (aluminum gallium oxide), the composition of gallium aluminum oxide (aluminum gallium oxide) can be set to be $Ga_xAl_{2-x}O_{3+a}$ ($0<X<2$, $0<a<1$) by heat treatment in an oxygen atmosphere or oxygen doping.

By oxygen doping, an insulating film including a region where the proportion of oxygen is higher than that in the stoichiometric composition can be formed. When the insulating film including such a region is in contact with the oxide semiconductor layer, oxygen that exists excessively in the insulating film is supplied to the oxide semiconductor layer, and oxygen deficiency in the oxide semiconductor layer or at the interface between the oxide semiconductor layer and the insulating film is reduced. Thus, the oxide semiconductor layer can be an intrinsic or substantially intrinsic oxide semiconductor.

The insulating film including a region where the proportion of oxygen is higher than that in the stoichiometric composition may be applied to either the insulating film placed on an upper side of the oxide semiconductor layer or the insulating film placed on a lower side of the oxide semiconductor layer of the insulating films which are in contact with the oxide semiconductor layer 716; however, it is preferable to apply such an insulating film to both the insulating films which are in contact with the oxide semiconductor layer 716. The above effect can be enhanced with a structure where the oxide semiconductor layer 716 is sandwiched between the insulating films each including a region where the proportion of oxygen is higher than that in the stoichiometric composition, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent element or different constituent elements. For example, the insulating films on the upper side and the lower side may be both formed using gallium oxide whose composition is $Ga_2O_X$ ($X=3+\alpha$, $0<\alpha<1$). Alternatively, one of the insulating films on the upper side and the lower side may be formed using $Ga_2O_X$ ($X=3+\alpha$, $0<\alpha<1$) and the other may be formed using aluminum oxide whose composition is $Al_2O_X$ ($X=3+\alpha$, $0<\alpha<1$).

The insulating film which is in contact with the oxide semiconductor layer 716 may be formed by a stack of insulating films each including a region where the proportion of oxygen is higher than that in the stoichiometric composition. For example, the insulating film on the upper side of the oxide semiconductor layer 716 may be formed as follows: gallium oxide whose composition is $Ga_2O_X$ ($X=3+\alpha$, $0<\alpha<1$) is formed and gallium aluminum oxide (aluminum gallium oxide) whose composition is $Ga_xAl_{2-x}O_{3+\alpha}$ ($0<X<2$, $0<\alpha<1$) may be formed thereover. Note that the insulating film on the lower side of the oxide semiconductor layer 716 may be formed by a stack of insulating films each including a region where the proportion of oxygen is higher than that in the stoichiometric composition. Alternatively, both the insulating films on the upper side and the lower side of the oxide semiconductor layer 716 may be formed by a stack of insulating films each including a region where the proportion of oxygen is higher than that in the stoichiometric composition.

Figure 15C:
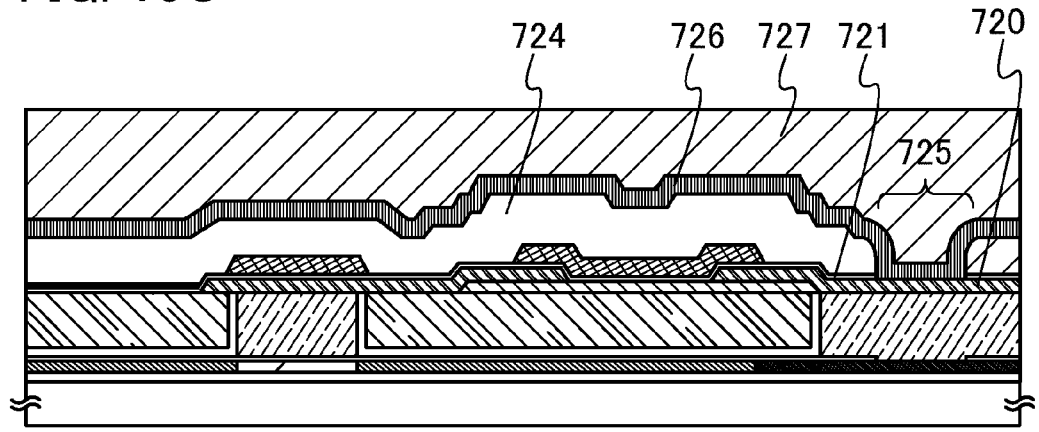

Next, as illustrated in FIG. 15C, an insulating film 724 is formed so as to cover the gate insulating film 721, the conductive film 723, and the gate electrode 722. The insulating film 724 can be formed by PVD, CVD, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

A conductive film is formed by PVD or CVD and then is etched, so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film is formed in a region including the opening of the insulating film 724 by PVD and a thin titanium film (with a thickness of approximately 5 nm) is formed by PVD, and then an aluminum film is formed so as to be embedded in the opening 725. Here, the titanium film formed by PVD has a function of reducing an oxide film (e.g., a native oxide film) formed on a surface over which the titanium film is formed, to decrease the contact resistance with the lower electrode or the like (here, the conductive film 720). In addition, hillocks of the aluminum film can be prevented. A copper film may be formed by a plating method after a barrier film of titanium, titanium nitride, or the like is formed.

The opening 725 formed in the insulating film 724 is preferably formed in a region overlapping with the conductive film 708. With provision of the opening 725 in such a region, the increase in element area due to a contact region can be inhibited.

Here, the case where a position where the impurity region 704 and the conductive film 720 are connected to each other and a position where the conductive film 720 and the wiring 726 are connected to each other overlap with each other without the use of the conductive film 708 is described. In that case, an opening (also referred to as an opening in a lower portion) is formed in the insulating films 712 and 713 that are formed over the impurity region 704, and the conductive film 720 is formed to cover the opening in the lower portion. After that, an opening (also referred to as an opening in an upper portion) is formed in a region overlapping with the opening in the lower portion in the gate insulating film 721 and the insulating film 724, and then the wiring 726 is formed. When the opening in the upper portion is formed in the region overlapping with the opening in the lower portion, the conductive film 720 formed in the opening in the lower portion might be disconnected by etching. In order to avoid the disconnection, the opening in the lower portion and the opening in the upper portion are formed so as not to overlap with each other, so that the problem of an increase in element area occurs.

As described in this embodiment, with the use of the conductive film 708, the opening in the upper portion can be formed without disconnection of the conductive film 720. Thus, the opening in the lower portion and the opening in the upper portion can be formed to overlap with each other, so that the increase in element area due to openings can be inhibited. In short, the integration degree of the semiconductor device can be improved.

Next, an insulating film 727 is formed to cover the wiring 726. Through the series of steps, the storage element 100b can be formed.

Note that in the formation method, the conductive films 719 and 720 functioning as a source and drain electrodes are formed after the formation of the oxide semiconductor layer 716. Thus, as illustrated in FIG. 15B, in the transistor 101 obtained by the manufacturing method, the conductive films 719 and 720 are formed over the oxide semiconductor layer 716. However, in the transistor 101, the conductive films functioning as a source and drain electrodes may be formed below the oxide semiconductor layer 716, that is, between the oxide semiconductor layer 716 and the insulating films 712 and 713.

Figure 16:
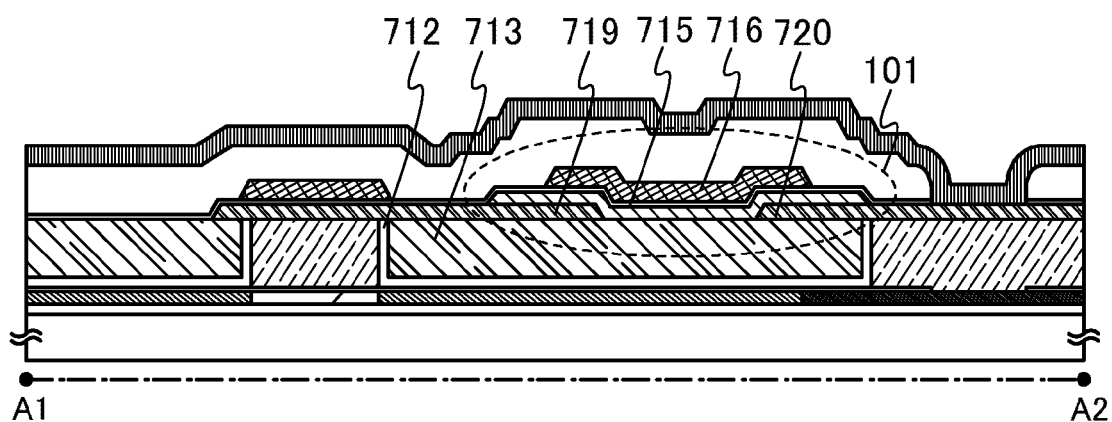
FIG. 16 is a cross-sectional view illustrating the structure of the storage element.

FIG. 16 is a cross-sectional view of the transistor 101 at the time when the conductive films 719 and 720 functioning as a source and drain electrodes are provided between the oxide semiconductor layer 716 and the insulating films 712 and 713. The transistor 101 illustrated in FIG. 16 can be obtained in such a manner that the conductive films 719 and 720 are formed after the formation of the insulating film 713, and then the oxide semiconductor layer 716 is formed.

As described above, the transistor and the capacitor included in the storage element of the memory element 300 can be formed in a manner similar to that of other transistors and capacitors included in the programmable LSI. For example, the transistor whose channel is formed in the oxide semiconductor layer included in the storage element of the memory element 300 can be formed over the substrate provided with the transistors included in the configuration memory 311, the look-up table 312, the selection circuit 314, and the register 313 in the logic element 310. In particular, the transistor whose channel is formed in the oxide semiconductor layer included in the storage element of the memory element 300 can be formed to overlap with at least some of the transistors included in the configuration memory 311, the look-up table 312, the selection circuit 314, and the register 313 in the logic element 310. In this manner, the memory element 300 which functions like a nonvolatile memory and the logic element 310 can be formed over one substrate. Thus, the programmable LSI can be made small. Further, the memory element 300 and the logic element 310 can be electrically connected to each other easily.

This embodiment can be combined with any of the other embodiments as appropriate.

Embodiment 7

In this embodiment, a transistor including an oxide semiconductor layer with a structure different from the structure in Embodiment 6 is described.

A transistor 901 illustrated in FIG. 17A includes an oxide semiconductor layer 903 that is formed over an insulating film 902 and functions as an active layer; a source electrode 904 and a drain electrode 905 that are formed over the oxide semiconductor layer 903; a gate insulating film 906 that is formed over the oxide semiconductor layer 903, the source electrode 904, and the drain electrode 905; and a gate electrode 907 that overlaps with the oxide semiconductor layer 903 over the gate insulating film 906.

The transistor 901 illustrated in FIG. 17A is a top-gate transistor in which the gate electrode 907 is formed over the oxide semiconductor layer 903 and is also a top-contact transistor in which the source electrode 904 and the drain electrode 905 are formed over the oxide semiconductor layer 903. In the transistor 901, the source electrode 904 and the drain electrode 905 do not overlap with the gate electrode 907. In other words, a gap which is larger than the thickness of the gate insulating film 906 is provided between the source electrode 904 and the gate electrode 907 and between the drain electrode 905 and the gate electrode 907. Thus, in the transistor 901, parasitic capacitance formed between the source electrode 904 and the gate electrode 907 and between the drain electrode 905 and the gate electrode 907 can be reduced. Consequently, high-speed operation can be performed The oxide semiconductor layer 903 includes a pair of high-concentration regions 908 that can be obtained by addition of a dopant imparting n-type conductivity to the oxide semiconductor layer 903 after the formation of the gate electrode 907. In addition, in the oxide semiconductor layer 903, a region which overlaps with the gate electrode 907 with the gate insulating film 906 provided therebetween is a channel formation region 909. The oxide semiconductor layer 903 includes the channel formation region 909 between the pair of high-concentration regions 908. Addition of a dopant for formation of the pair of high-concentration regions 908 can be performed by ion implantation. A rare gas such as helium, argon, or xenon; a Group 15 atom such as nitrogen, phosphorus, arsenic, or antimony; or the like can be used as the dopant, for example.

For example, in the case where nitrogen is used as the dopant, the concentration of nitrogen atoms in the high-concentration region 908 is preferably $5 \times 10^{19}/cm^3$ or higher and $1 \times 10^{22}/cm^3$ or lower.

The high-concentration region 908 to which the dopant imparting n-type conductivity is added has higher conductivity than other regions in the oxide semiconductor layer 903. Thus, with provision of the high-concentration regions 908 in the oxide semiconductor layer 903, resistance between the source electrode 904 and the drain electrode 905 can be lowered.

In the case where an In—Ga—Zn-based oxide semiconductor is used for the oxide semiconductor layer 903, an oxide semiconductor in the high-concentration regions 908 has a wurtzite crystal structure by heat treatment at 300 to 600° C. for 1 hour after the addition of nitrogen. When the oxide semiconductor in the high-concentration regions 908 has a wurtzite crystal structure, the conductivity of the high-concentration regions 908 can be further increased and the resistance between the source electrode 904 and the drain electrode 905 can be further lowered. Note that in order to effectively lower the resistance between the source electrode 904 and the drain electrode 905 by formation of an oxide semiconductor with a wurtzite crystal structure, the concentration of nitrogen atoms in the high-concentration region 908 is preferably $1 \times 10^{20}/cm^3$ or higher and 7 at. % or lower in the case where nitrogen is used as the dopant. Even in the case where the concentration of nitrogen atoms is lower than the above range, an oxide semiconductor with a wurtzite crystal structure can be obtained in some cases.

Alternatively, the oxide semiconductor layer 903 may be formed using an oxide including a CAAC. In the case where the oxide semiconductor layer 903 is formed using an oxide including a CAAC, the conductivity of the oxide semiconductor layer 903 can be increased as compared to the case where an amorphous crystal is used. Thus, the resistance between the source electrode 904 and the drain electrode 905 can be lowered.

When the resistance between the source electrode 904 and the drain electrode 905 is lowered, high on-state current and high-speed operation can be secured even when the transistor 901 is miniaturized. In addition, by miniaturization of the transistor 901, the area of a storage element including the transistor can be reduced, so that memory capacity per unit area can be increased.

A transistor 911 illustrated in FIG. 17B includes a source electrode 914 and a drain electrode 915 that are formed over an insulating film 912; an oxide semiconductor layer 913 that is formed over the source electrode 914 and the drain electrode 915 and functions as an active layer; a gate insulating film 916 that is formed over the oxide semiconductor layer 913, the source electrode 914, and the drain electrode 915; and a gate electrode 917 that overlaps with the oxide semiconductor layer 913 over the gate insulating film 916.

The transistor 911 illustrated in FIG. 17B is a top-gate transistor in which the gate electrode 917 is formed over the oxide semiconductor layer 913 and is also a bottom-contact transistor in which the source electrode 914 and the drain electrode 915 are formed below the oxide semiconductor layer 913. As in the transistor 901, in the transistor 911, the source electrode 914 and the drain electrode 915 do not overlap with the gate electrode 917. Thus, parasitic capacitance formed between the source electrode 914 and the gate electrode 917 and between the drain electrode 915 and the gate electrode 917 can be reduced. Consequently, high-speed operation can be performed.

The oxide semiconductor layer 913 includes a pair of high-concentration regions 918 that can be obtained by addition of a dopant imparting n-type conductivity to the oxide semiconductor layer 913 after the formation of the gate electrode 917. In addition, in the oxide semiconductor layer 913, a region which overlaps with the gate electrode 917 with the gate insulating film 916 provided therebetween is a channel formation region 919. The oxide semiconductor layer 913 includes the channel formation region 919 between the pair of high-concentration regions 918.

The pair of high-concentration regions 918 can be formed by ion implantation as in the high-concentration regions 908 of the transistor 901. The high-concentration regions 908 can be referred to for the kind of a dopant used for the formation of the high-concentration regions 918.

For example, in the case where nitrogen is used as the dopant, the concentration of nitrogen atoms in the high-concentration region 918 is preferably $5 \times 10^{19}/cm^3$ or higher and $1 \times 10^{22}/cm^3$ or lower.

The high-concentration region 918 to which the dopant imparting n-type conductivity is added has higher conductivity than other regions in the oxide semiconductor layer 913. Thus, with provision of the high-concentration regions 918 in the oxide semiconductor layer 913, resistance between the source electrode 914 and the drain electrode 915 can be lowered.

In the case where an In—Ga—Zn-based oxide semiconductor is used for the oxide semiconductor layer 913, an oxide semiconductor in the high-concentration regions 918 has a wurtzite crystal structure by heat treatment at approximately 300 to 600° C. after the addition of nitrogen. When the oxide semiconductor in the high-concentration regions 918 has a wurtzite crystal structure, the conductivity of the high-concentration regions 918 can be further increased and the resistance between the source electrode 914 and the drain electrode 915 can be further lowered. Note that in order to effectively lower the resistance between the source electrode 914 and the drain electrode 915 by formation of an oxide semiconductor with a wurtzite crystal structure, the concentration of nitrogen atoms in the high-concentration region 918 is preferably $1 \times 10^{20}/cm^3$ or higher and 7 at. % or lower in the case where nitrogen is used as the dopant. Even in the case where the concentration of nitrogen atoms is lower than the above range, an oxide semiconductor with a wurtzite crystal structure can be obtained in some cases.

Alternatively, the oxide semiconductor layer 913 may be formed using an oxide including a CAAC. In the case where the oxide semiconductor layer 913 is formed using an oxide including a CAAC, the conductivity of the oxide semiconductor layer 913 can be increased as compared to the case where an amorphous crystal is used. Thus, the resistance between the source electrode 914 and the drain electrode 915 can be lowered.

When the resistance between the source electrode 914 and the drain electrode 915 is lowered, high on-state current and high-speed operation can be secured even when the transistor 911 is miniaturized. In addition, by miniaturization of the transistor 911, the area of a storage element including the transistor can be reduced, so that memory capacity per unit area can be increased.

A transistor 921 illustrated in FIG. 17C includes an oxide semiconductor layer 923 that is formed over an insulating film 922 and functions as an active layer; a source electrode 924 and a drain electrode 925 that are formed over the oxide semiconductor layer 923; a gate insulating film 926 that is formed over the oxide semiconductor layer 923, the source electrode 924, and the drain electrode 925; and a gate electrode 927 that overlaps with the oxide semiconductor layer 923 over the gate insulating film 926. The transistor 921 further includes sidewalls 930 that are provided at ends of the gate electrode 927 and are formed using an insulating film.

The transistor 921 illustrated in FIG. 17C is a top-gate transistor in which the gate electrode 927 is formed over the oxide semiconductor layer 923 and is also a top-contact transistor in which the source electrode 924 and the drain electrode 925 are formed over the oxide semiconductor layer 923. As in the transistor 901, in the transistor 921, the source electrode 924 and the drain electrode 925 do not overlap with the gate electrode 927. Thus, parasitic capacitance formed between the source electrode 924 and the gate electrode 927 and between the drain electrode 925 and the gate electrode 927 can be reduced. Consequently, high-speed operation can be performed.

The oxide semiconductor layer 923 includes a pair of high-concentration regions 928 and a pair of low-concentration regions 929 that can be obtained by addition of a dopant imparting n-type conductivity to the oxide semiconductor layer 923 after the formation of the gate electrode 927. In addition, in the oxide semiconductor layer 923, a region which overlaps with the gate electrode 927 with the gate insulating film 926 provided therebetween is a channel formation region 931. The oxide semiconductor layer 923 includes the pair of low-concentration regions 929 between the pair of high-concentration regions 928 and the channel formation region 931 between the pair of low-concentration regions 929. Further, the pair of low-concentration regions 929 is provided in a region of the oxide semiconductor layer 923 that overlaps with the sidewalls 930 with the gate insulating film 926 provided therebetween.

The pair of high-concentration regions 928 and the pair of low-concentration regions 929 can be formed by ion implantation as in the high-concentration regions 908 of the transistor 901. The high-concentration regions 908 can be referred to for the kind of a dopant used for the formation of the high-concentration regions 928.

For example, in the case where nitrogen is used as the dopant, the concentration of nitrogen atoms in the high-concentration region 928 is preferably $5\times10^{19}/cm^3$ or higher and $1\times10^{22}/cm^3$ or lower. Further, for example, in the case where nitrogen is used as the dopant, the concentration of nitrogen atoms in the low-concentration region 929 is preferably $5\times10^{18}/cm^3$ or higher and lower than $5\times10^{19}/cm^3$.

The high-concentration region 928 to which the dopant imparting n-type conductivity is added has higher conductivity than other regions in the oxide semiconductor layer 923. Thus, with provision of the high-concentration regions 928 in the oxide semiconductor layer 923, resistance between the source electrode 924 and the drain electrode 925 can be lowered. Further, with provision of the low-concentration region 929 between the channel formation region 931 and the high-concentration region 928, a negative shift in threshold voltage due to a short channel effect can be reduced.

In the case where an In—Ga—Zn-based oxide semiconductor is used for the oxide semiconductor layer 923, an oxide semiconductor in the high-concentration regions 928 has a wurtzite crystal structure by heat treatment at approximately 300 to 600° C. after the addition of nitrogen. Further, depending on the concentration of nitrogen, the low-concentration region 929 has a wurtzite crystal structure in some cases. When the oxide semiconductor in the high-concentration regions 928 has a wurtzite crystal structure, the conductivity of the high-concentration regions 928 can be further increased and the resistance between the source electrode 924 and the drain electrode 925 can be further lowered. Note that in order to effectively lower the resistance between the source electrode 924 and the drain electrode 925 by formation of an oxide semiconductor with a wurtzite crystal structure, the concentration of nitrogen atoms in the high-concentration region 928 is preferably $1\times10^{20}/cm^3$ or higher and 7 at. % or lower in the case where nitrogen is used as the dopant. Even in the case where the concentration of nitrogen atoms is lower than the above range, an oxide semiconductor with a wurtzite crystal structure can be obtained in some cases.

Alternatively, the oxide semiconductor layer 923 may be formed using an oxide including a CAAC. In the case where the oxide semiconductor layer 923 is formed using an oxide including a CAAC, the conductivity of the oxide semiconductor layer 923 can be increased as compared to the case where an amorphous crystal is used. Thus, the resistance between the source electrode 924 and the drain electrode 925 can be lowered.

When the resistance between the source electrode 924 and the drain electrode 925 is lowered, high on-state current and high-speed operation can be secured even when the transistor 921 is miniaturized. In addition, by miniaturization of the transistor 921, the area of a memory cell including the transistor can be reduced, so that memory capacity per unit area can be increased.

A transistor 941 illustrated in FIG. 17D includes a source electrode 944 and a drain electrode 945 that are formed over an insulating film 942; an oxide semiconductor layer 943 that is formed over the source electrode 944 and the drain electrode 945 and functions as an active layer; a gate insulating film 946 that is formed over the oxide semiconductor layer 943, the source electrode 944, and the drain electrode 945; and a gate electrode 947 that overlaps with the oxide semiconductor layer 943 over the gate insulating film 946. The transistor 941 further includes sidewalls 950 that are provided at ends of the gate electrode 947 and are formed using an insulating film.

The transistor 941 illustrated in FIG. 17D is a top-gate transistor in which the gate electrode 947 is formed over the oxide semiconductor layer 943 and is also a bottom-contact transistor in which the source electrode 944 and the drain electrode 945 are formed below the oxide semiconductor layer 943. As in the transistor 901, in the transistor 941, the source electrode 944 and the drain electrode 945 do not overlap with the gate electrode 947. Thus, parasitic capacitance formed between the source electrode 944 and the gate electrode 947 and between the drain electrode 945 and the gate electrode 947 can be reduced. Consequently, high-speed operation can be performed.

The oxide semiconductor layer 943 includes a pair of high-concentration regions 948 and a pair of low-concentration regions 949 that can be obtained by addition of a dopant imparting n-type conductivity to the oxide semiconductor layer 943 after the formation of the gate electrode 947. In addition, in the oxide semiconductor layer 943, a region which overlaps with the gate electrode 947 with the gate insulating film 946 provided therebetween is a channel formation region 951. The oxide semiconductor layer 943 includes the pair of low-concentration regions 949 between the pair of high-concentration regions 948 and the channel formation region 951 between the pair of low-concentration regions 949. Further, the pair of low-concentration regions 949 is provided in a region of the oxide semiconductor layer 943 that overlaps with the sidewalls 950 with the gate insulating film 946 provided therebetween.

The pair of high-concentration regions 948 and the pair of low-concentration regions 949 can be formed by ion implantation as in the high-concentration regions 908 of the transistor 901. The high-concentration regions 908 can be referred to for the kind of a dopant used for the formation of the high-concentration regions 948.

For example, in the case where nitrogen is used as the dopant, the concentration of nitrogen atoms in the high-concentration region 948 is preferably $5\times10^{19}/cm^3$ or higher and $1\times10^{22}/cm^3$ or lower. Further, for example, in the case where nitrogen is used as the dopant, the concentration of nitrogen atoms in the low-concentration region 949 is preferably $5\times10^{18}/cm^3$ or higher and lower than $5\times10^{19}/cm^3$.

The high-concentration region 948 to which the dopant imparting n-type conductivity is added has higher conductivity than other regions in the oxide semiconductor layer 943. Thus, with provision of the high-concentration regions 948 in the oxide semiconductor layer 943, resistance between the source electrode 944 and the drain electrode 945 can be lowered. Further, with provision of the low-concentration region 949 between the channel formation region 951 and the high-concentration region 948, a negative shift in threshold voltage due to a short channel effect can be reduced.

In the case where an In—Ga—Zn-based oxide semiconductor is used for the oxide semiconductor layer 943, an oxide semiconductor in the high-concentration regions 948 has a wurtzite crystal structure by heat treatment at approximately 300 to 600° C. after the addition of nitrogen. Further, depending on the concentration of nitrogen, the low-concentration region 949 has a wurtzite crystal structure in some cases. When the oxide semiconductor in the high-concentration regions 948 has a wurtzite crystal structure, the conductivity of the high-concentration regions 948 can be further increased and the resistance between the source electrode 944 and the drain electrode 945 can be further lowered. Note that in order to effectively lower the resistance between the source electrode 944 and the drain electrode 945 by formation of an oxide semiconductor with a wurtzite crystal structure, the concentration of nitrogen atoms in the high-concentration region 948 is preferably $1 \times 10^{20}/cm^3$ or higher and 7 at. % or lower in the case where nitrogen is used as the dopant. Even in the case where the concentration of nitrogen atoms is lower than the above range, an oxide semiconductor with a wurtzite crystal structure can be obtained in some cases.

Alternatively, the oxide semiconductor layer 943 may be formed using an oxide including a CAAC. In the case where the oxide semiconductor layer 943 is formed using an oxide including a CAAC, the conductivity of the oxide semiconductor layer 943 can be increased as compared to the case where an amorphous crystal is used. Thus, the resistance between the source electrode 944 and the drain electrode 945 can be lowered.

When the resistance between the source electrode 944 and the drain electrode 945 is lowered, high on-state current and high-speed operation can be secured even when the transistor 941 is miniaturized. In addition, by miniaturization of the transistor 941, the area of a storage element including the transistor can be reduced, so that memory capacity per unit area can be increased.

Note that as one of methods for forming a high-concentration region functioning as a source region or a drain region in a transistor including an oxide semiconductor through a self-aligning process, a method has been disclosed by which a surface of an oxide semiconductor layer is exposed, argon plasma treatment is performed, and the resistance of a region in the oxide semiconductor layer that is exposed to plasma is lowered (S. Jeon et al., "180 nm Gate Length Amorphous InGaZnO Thin Film Transistor for High Density Image Sensor Applications", IEDM Tech. Dig., pp. 504-507, 2010).

However, in the formation method, it is necessary to remove a gate insulating film partly so that a region serving as a source region or a drain region is exposed after the formation of the gate insulating film. Thus, when the gate insulating film is removed, the oxide semiconductor layer that is the lower layer is over etched partly, so that the thickness of the region serving as the source region or the drain region is decreased. Consequently, the resistance of the source region or the drain region is increased and defects in characteristics of the transistor due to over etching easily occur.

In order to miniaturize the transistor, it is necessary to employ dry etching, which has high processing accuracy. The over etching particularly occurs easily in the case where dry etching, which cannot secure selectivity of the oxide semiconductor layer with respect to the gate insulating film sufficiently.

For example, over etching does not matter when the oxide semiconductor layer has sufficient large thickness. However, in the case where the channel length is 200 nm or less, it is necessary that the thickness of a region in the oxide semiconductor layer that serves as a channel formation region be 20 nm or less, preferably 10 nm or less in order to prevent a short channel effect. In the case where such a thin oxide semiconductor layer is used, the over etching of the oxide semiconductor layer is unfavorable because the resistance of the source region or the drain region is increased and defects in characteristics of the transistor occur as described above.

However, when a dopant is added to the oxide semiconductor layer while the oxide semiconductor layer is not exposed and the gate insulating film is left as in one embodiment of the present invention, the over etching of the oxide semiconductor layer can be prevented and excessive damage to the oxide semiconductor layer can be reduced. Further, an interface between the oxide semiconductor layer and the gate insulating film is kept clean. Thus, the characteristics and reliability of the transistor can be improved.

This embodiment can be combined with any of the other embodiments as appropriate.

EXAMPLE 1

With the use of a semiconductor device including a programmable LSI according to one embodiment of the present invention, a low-power electronic device can be provided. In particular, in the case where a portable electronic device which has difficulty in continuously receiving power, an advantage of an increase in continuous operating time can be obtained when a low-power semiconductor device according to one embodiment of the present invention is added as a component of the device.

The semiconductor device including a programmable LSI according to one embodiment of the present invention can be used for display devices, personal computers, or image reproducing devices provided with recording media (typically, devices which reproduce the content of recording media such as digital versatile discs (DVDs) and have displays for displaying the reproduced images). Further, as an electronic device which can include the semiconductor device including a programmable LSI according to one embodiment of the present invention, cellular phones, portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

The case is described in which the semiconductor device including a programmable LSI according to one embodiment of the present invention is applied to a portable electronic device such as a cellular phone, a smartphone, or an e-book reader.

Figure 18:
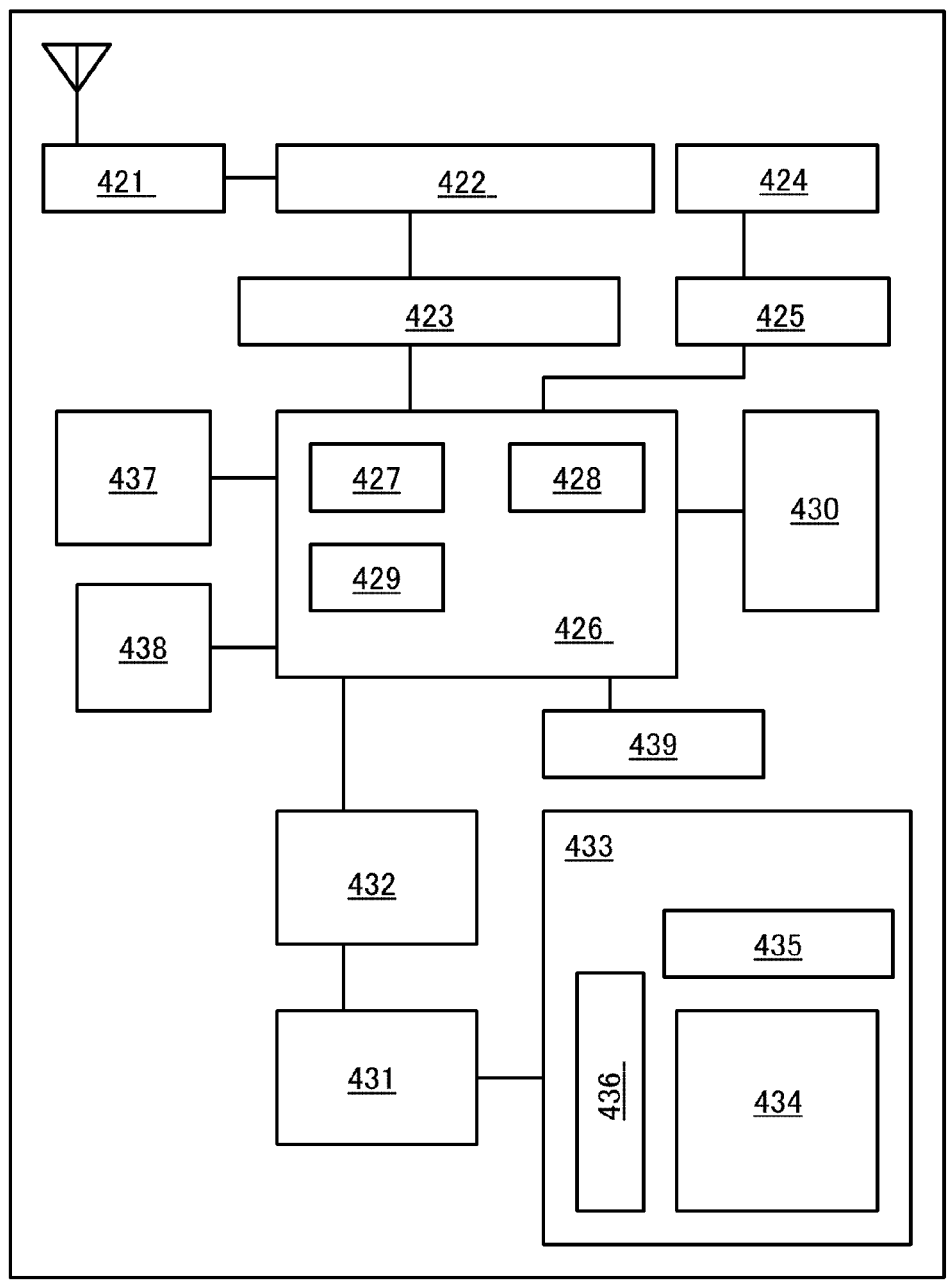
FIG. 18 is a block diagram of a portable electronic device.

FIG. 18 is a block diagram of a portable electronic device. The portable electronic device illustrated in FIG. 18 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. When the programmable LSI described in the above embodiment is used as the CPU 427, power consumption can be reduced.

Figure 19:
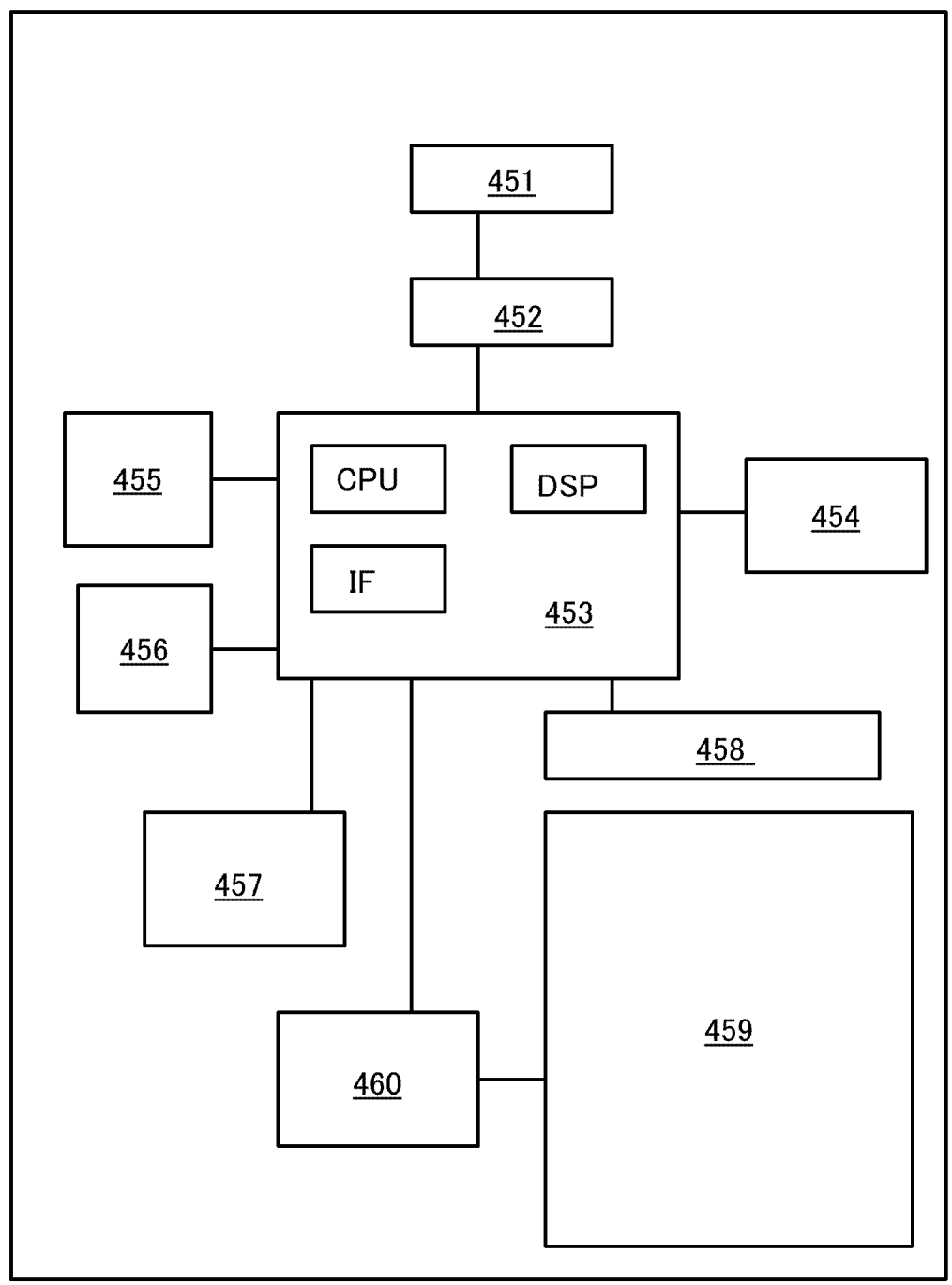
FIG. 19 is a block diagram of an e-book reader.

FIG. 19 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. When the programmable LSI described in the above embodiment is used as the microprocessor 453, power consumption can be reduced. Further, when the storage device described in the above embodiment is used as the memory circuit 457, power consumption can be reduced.

This example can be combined with any of the above embodiments as appropriate.

This application is based on Japanese Patent Application serial No. 2011-031790 filed with Japan Patent Office on Feb. 17, 2011, the entire contents of which are hereby incorporated by reference.

What is claimed is:

1. A semiconductor device comprising:
a logic element; and
a memory element comprising a storage element,
wherein the memory element is configured to store configuration data in the storage element and output the configuration data,
wherein the logic element is configured to receive the configuration data and change a function of the logic element in accordance with the configuration data, and
wherein the storage element comprises a first transistor comprising an oxide semiconductor layer, a second transistor, and a third transistor,
wherein a gate of the first transistor is electrically connected to a first wiring,
wherein a first terminal of the first transistor is electrically connected to a second wiring,
wherein a second terminal of the first transistor is electrically connected to a gate of the second transistor,
wherein a first terminal of the second transistor is electrically connected to a third wiring,
wherein a second terminal of the second transistor is electrically connected to a first terminal of the third transistor,
wherein a second terminal of the third transistor is electrically connected to a fourth wiring,
wherein a gate of the third transistor is electrically connected to a fifth wiring, and
wherein the memory element is configured to output the configuration data through the fourth wiring.

2. The semiconductor device according to claim 1,
wherein the second wiring is electrically connected to the fourth wiring.

3. The semiconductor device according to claim 1,
wherein the logic element comprises a selection circuit,
wherein the selection circuit comprises a first input terminal, a second input terminal, and an output terminal,
wherein the first input terminal is configured to receive a first voltage,
wherein the second input terminal is configured to receive a second voltage,
wherein the selection circuit is configured to output the first voltage while the configuration data is first data, and
wherein the selection circuit is configured to output the second voltage while the configuration data is second data.

4. A semiconductor device comprising:
a first logic element;
a second logic element;
a selection circuit; and
a memory element comprising a storage element,
wherein the memory element is configured to store configuration data in the storage element and output the configuration data,
wherein the selection circuit is configured to receive the configuration data and change an electrical connection between the first logic element and the second logic element in accordance with the configuration data, and
wherein the storage element comprises a first transistor comprising an oxide semiconductor layer, a second transistor, and a third transistor,
wherein a gate of the first transistor is electrically connected to a first wiring,
wherein a first terminal of the first transistor is electrically connected to a second wiring,
wherein a second terminal of the first transistor is electrically connected to a gate of the second transistor,
wherein a first terminal of the second transistor is electrically connected to a third wiring,
wherein a second terminal of the second transistor is electrically connected to a first terminal of the third transistor,
wherein a second terminal of the third transistor is electrically connected to a fourth wiring,
wherein a gate of the third transistor is electrically connected to a fifth wiring, and
wherein the memory element is configured to output the configuration data through the fourth wiring.

5. The semiconductor device according to claim 4,
wherein the second wiring is electrically connected to the fourth wiring.

6. The semiconductor device according to claim 4,
wherein the selection circuit comprises a first input terminal, a second input terminal, and an output terminal,
wherein the first input terminal is configured to receive a first voltage from an output terminal of the first logic element,
wherein the second input terminal is configured to receive a second voltage,
wherein the selection circuit is configured to output the first voltage to an input terminal of the second logic element while the configuration data is first data, and
wherein the selection circuit is configured to output the second voltage to the input terminal of the second logic element while the configuration data is second data.

7. A semiconductor device comprising:
a logic element; and
a memory element comprising a first storage element and a second storage element,
wherein the memory element is configured to store first configuration data in the first storage element and second configuration data in the second storage element,
wherein the memory element is configured to output one of the first configuration data and the second configuration data,
wherein the logic element is configured to receive the one of the first configuration data and the second configuration data, change a function of the logic element after the logic element receives the first configuration data, and change the function of the logic element after the logic element receives the second configuration data, and
wherein the first storage element comprises a first transistor comprising an oxide semiconductor layer, a second transistor, and a third transistor,
wherein a gate of the first transistor is electrically connected to a first wiring,
wherein a first terminal of the first transistor is electrically connected to a second wiring, wherein a second terminal of the first transistor is electrically connected to a gate of the second transistor, wherein a first terminal of the second transistor is electrically connected to a third wiring, wherein a second terminal of the second transistor is electrically connected to a first terminal of the third transistor, wherein a second terminal of the third transistor is electrically connected to a fourth wiring, wherein a gate of the third transistor is electrically connected to a fifth wiring, and wherein the memory element is configured to output the first configuration data through the fourth wiring.

8. The semiconductor device according to claim 7, wherein the second wiring is electrically connected to the fourth wiring.

9. The semiconductor device according to claim 7, wherein the logic element comprises a selection circuit, wherein the selection circuit comprises a first input terminal, a second input terminal, and an output terminal, wherein the first input terminal is configured to receive a first voltage, wherein the second input terminal is configured to receive a second voltage, wherein the selection circuit is configured to output the first voltage after the logic element receives the first configuration data, and wherein the selection circuit is configured to output the second voltage after the logic element receives the second configuration data.

* * * * *